US008403613B2

(12) United States Patent
van der Meulen

(10) Patent No.: US 8,403,613 B2
(45) Date of Patent: Mar. 26, 2013

(54) BYPASS THERMAL ADJUSTER FOR VACUUM SEMICONDUCTOR PROCESSING

(75) Inventor: Peter van der Meulen, Newburyport, MA (US)

(73) Assignee: Brooks Automation, Inc., Chelmsford, MA (US)

(*) Notice: Subject to any disclaimer, the term of this patent is extended or adjusted under 35 U.S.C. 154(b) by 573 days.

(21) Appl. No.: 11/681,822

(22) Filed: Mar. 5, 2007

(65) Prior Publication Data

US 2008/0014055 A1 Jan. 17, 2008

Related U.S. Application Data

(63) Continuation-in-part of application No. 11/679,829, filed on Feb. 27, 2007, now abandoned, and a continuation-in-part of application No. 10/985,834, filed on Nov. 10, 2004, now Pat. No. 7,458,763.

(60) Provisional application No. 60/777,443, filed on Feb. 27, 2006, provisional application No. 60/518,823, filed on Nov. 10, 2003, provisional application No. 60/607,649, filed on Sep. 7, 2004, provisional application No. 60/779,684, filed on Mar. 5, 2006, provisional application No. 60/779,707, filed on Mar. 5, 2006, provisional application No. 60/779,478, filed on Mar. 5, 2006, provisional application No. 60/779,463, filed on Mar. 5, 2006, provisional application No. 60/779,609, filed on Mar. 5, 2006, provisional application No. 60/784,832, filed on Mar. 21, 2006, provisional application No. 60/746,163, filed on May 1, 2006, provisional application No. 60/807,189, filed on Jul. 12, 2006, provisional application No. 60/823,454, filed on Aug. 24, 2006.

(51) Int. Cl.
*B65G 49/07* (2006.01)

(52) U.S. Cl. ........................ 414/217; 414/939

(58) Field of Classification Search .................. None
See application file for complete search history.

(56) References Cited

U.S. PATENT DOCUMENTS

| 5,439,547 | A | * | 8/1995 | Kumagai .................. 156/345.31 |
| 5,636,960 | A | * | 6/1997 | Hiroki et al. ................... 414/781 |
| 5,882,165 | A | * | 3/1999 | Maydan et al. .............. 414/217 |
| 5,882,413 | A | * | 3/1999 | Beaulieu et al. .............. 118/719 |
| 6,053,686 | A | * | 4/2000 | Kyogoku ....................... 414/217 |
| 6,059,507 | A | * | 5/2000 | Adams .......................... 414/217 |
| 6,079,928 | A | * | 6/2000 | Theriault et al. .............. 414/217 |
| 6,234,107 | B1 | * | 5/2001 | Tanaka et al. .............. 118/723 R |
| 6,338,626 | B1 | * | 1/2002 | Saeki ............................ 432/243 |
| 6,440,261 | B1 | * | 8/2002 | Tepman et al. .......... 414/222.01 |
| 6,486,444 | B1 | * | 11/2002 | Fairbairn et al. .............. 219/390 |
| 6,530,732 | B1 | * | 3/2003 | Theriault et al. .............. 414/217 |
| 6,558,509 | B2 | * | 5/2003 | Kraus et al. ............... 156/345.54 |
| 6,719,517 | B2 | * | 4/2004 | Beaulieu et al. .............. 414/217 |
| 6,729,824 | B2 | * | 5/2004 | Lei et al. ....................... 414/217 |
| 6,742,977 | B1 | * | 6/2004 | Okayama et al. .............. 414/217 |
| 7,207,766 | B2 | * | 4/2007 | Kurita et al. .................. 414/641 |
| 7,467,916 | B2 | * | 12/2008 | Yamagishi et al. ........... 414/217 |
| 7,665,951 | B2 | * | 2/2010 | Kurita et al. .................. 414/805 |
| 2003/0131458 | A1 | * | 7/2003 | Wang et al. .................. 29/25.01 |
| 2004/0221871 | A1 | * | 11/2004 | Fletcher et al. .................... 134/6 |
| 2004/0240971 | A1 | * | 12/2004 | Tezuka et al. ................. 414/217 |
| 2006/0177288 | A1 | * | 8/2006 | Parker et al. .................. 414/217 |

* cited by examiner

*Primary Examiner* — James Keenan
(74) *Attorney, Agent, or Firm* — Perman & Green, LLP; Colin C. Durham

(57) ABSTRACT

A bypass thermal adjuster, which may be placed between two robots, provides a chamber for isolation and thermal control of wafers while permitting other wafers to be passed through the adjuster by the robots.

19 Claims, 21 Drawing Sheets

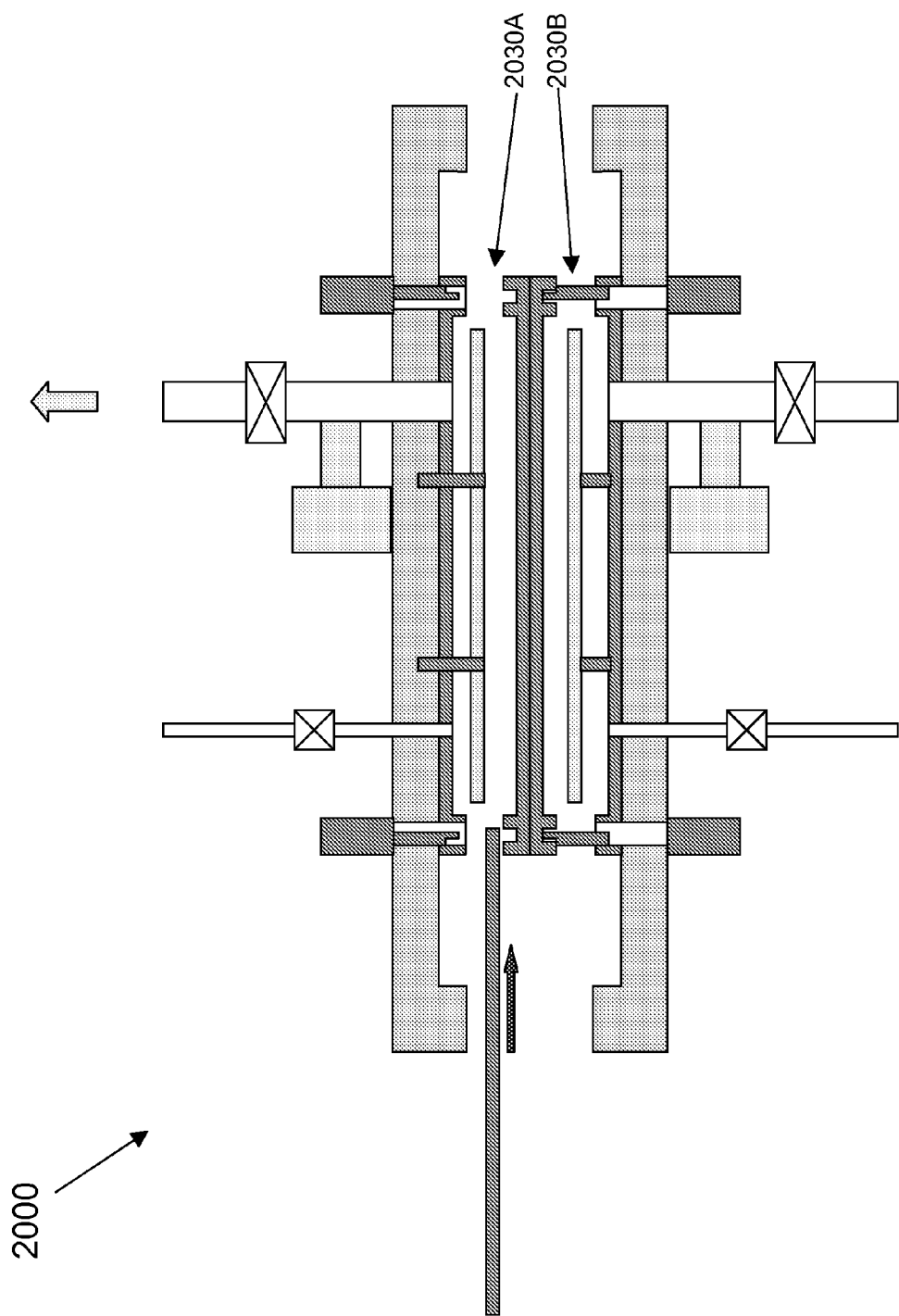

BYPASS THERMAL ADJUSTER FOR VACUUM SEMICONDUCTOR PROCESSING

RELATED APPLICATIONS

This application is a continuation-in-part of U.S. application Ser. No. 11/679,829 filed on Feb. 27, 2007 now abandoned, which claims the benefit of U.S. Prov. App. No. 60/777,443 filed on Feb. 27, 2006, and is a continuation-in-part of U.S. application Ser. No. 10/985,834 filed on Nov. 10, 2004 now U.S. Pat. No. 7,458,763 ,which claims the benefit of U.S. Prov. App. No. 60/518,823 filed on Nov. 10, 2003 and U.S. Prov. App. No. 60/607,649 filed on Sep. 7, 2004.

This application also claims the benefit of the following U.S. applications: U.S. Prov. App. No. 60/779,684 filed on Mar. 5, 2006; U.S. Prov. App. No. 60/779,707 filed on Mar. 5, 2006; U.S. Prov. App. No. 60/779,478 filed on Mar. 5, 2006; U.S. Prov. App. No. 60/779,463 filed on Mar. 5, 2006; U.S. Prov. App. No. 60/779,609 filed on Mar. 5, 2006; U.S. Prov. App. No. 60/784,832 filed on Mar. 21, 2006; U.S. Prov. App. No. 60/746,163 filed on May 1, 2006; U.S. Prov. App. No. 60/807,189 filed on Jul. 12, 2006; and U.S. Prov. App. No. 60/823,454 filed on Aug. 24, 2006.

All of the foregoing applications are commonly owned, and all of the foregoing applications are incorporated herein by reference.

BACKGROUND

1. Field

The invention herein disclosed generally relates to semiconductor processing systems, and specifically relates to thermal adjustment of work pieces in a vacuum semiconductor processing environment.

2. Description of the Related Art

Semiconductor processes often require careful control of work piece temperatures. This may include heating, cooling, or maintaining a target temperature as the work piece is moved from process to process within a multi-process, vacuum processing system. Due to the high cost of space within a vacuum environment, the space for handling and storing work pieces such as wafers is generally kept small. However, these space constraints can limit the ability to move multiple workpieces independently within the vacuum, and traffic bottlenecks can occur in buffers between processes. As fabrication processes grow in size and complexity, the difficulties of thermal management and wafer movement become greater.

There remains a need for semiconductor handling equipment that addresses these dual challenges of thermal management and wafer movement within a vacuum environment.

SUMMARY

A bypass thermal adjuster, which may be placed between two robots, provides a chamber for isolation and thermal control of wafers while permitting other wafers to be passed through the adjuster by the robots.

A system and method disclosed herein may include a vacuum module in a semiconductor manufacturing system; a sealable enclosure within an interior of the vacuum module, the sealable enclosure may include a support for at least one wafer, and the sealable enclosure may be capable of selectively isolating an environment within the sealable enclosure from the interior of the vacuum module; and a thermal management system that may control a temperature of the at least one wafer within the sealable enclosure.

The system and method disclosed herein may further include a plurality of sealable enclosures within the interior of the vacuum module.

The system and method disclosed herein may further include a plurality of entries to the vacuum module for access by a robotic wafer handler.

The system and method disclosed herein may further include a vacuum management system to control a vacuum within the environment of the sealable enclosure.

The environment of the sealable enclosure may be an argon environment, a nitrogen environment, a helium environment, or the like.

The thermal management system may cool the at least one wafer. The thermal management system may heat the at least one wafer. The thermal management system may directly contact the wafer.

The vacuum module may be coupled to a semiconductor fabrication system.

The vacuum module may permit additional wafers to pass through the interior while the sealable enclosure holds the at least one wafer in isolation.

The system and method may further include a second sealable enclosure within the interior of the vacuum module, the second sealable enclosure may include a second support for at least one second wafer, and the second sealable enclosure may be capable of selectively isolating a second environment within the second sealable enclosure from the interior of the vacuum module. The second sealable enclosure may be vertically stacked with the sealable enclosure. The second sealable enclosure can be isolated independently from the sealable enclosure. The sealable enclosure and the second sealable enclosure may operate in opposition, whereby only one of the enclosures may be isolated at one time. The vacuum module may permit additional wafers to pass through the interior while the sealable enclosure holds the at least one wafer in isolation. The vacuum module may permit additional wafers to pass through the interior while the second sealable enclosure holds the at least one second wafer in isolation.

The sealable enclosure may include one or more slot valves.

A method and system disclosed herein may include receiving a first wafer in a vacuum module; isolating the first wafer in an isolation environment; heating the first wafer in the isolation environment; and passing a second wafer through the vacuum module while heating the first wafer. Passing the second wafer through the vacuum module may include temporarily storing the second wafer in the vacuum module.

The method and system may further include passing a third wafer through the vacuum module while temporarily storing the second module.

These and other systems, methods, objects, features, and advantages of the present invention will be apparent to those skilled in the art from the following detailed description of the preferred embodiment and the drawings. All documents mentioned herein are hereby incorporated in their entirety by reference.

BRIEF DESCRIPTION OF THE FIGURES

The invention and the following detailed description of certain embodiments thereof may be understood by reference to the following figures:

FIG. 21 shows the embodiment of FIG. 20 alternatively with the lower enclosure filing with gas.

DETAILED DESCRIPTION

Figure 1:
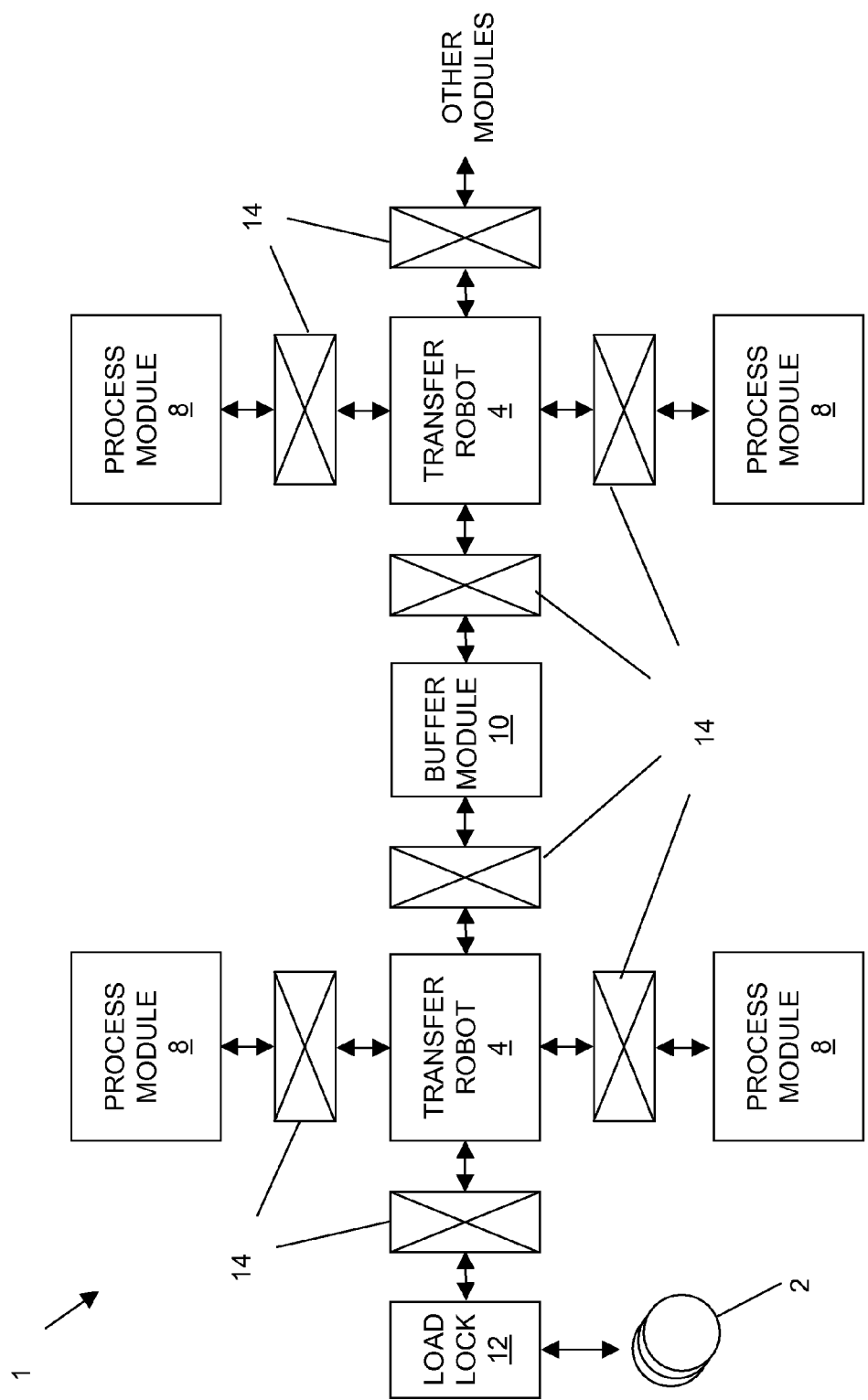
FIG. 1 shows a generalized semiconductor manufacturing system.

FIG. 1 shows a generalized layout of a semiconductor manufacturing system. The system 1 may include one or more wafers 2, a load lock 12, one or more transfer robots 4, one or more process modules 8, one or more buffer modules 10, and a plurality of slot valves 14 or other isolation valves for selectively isolated chambers of the system 1, such as during various processing steps. In general operation, the system 1 operates to process wafers for use in, for example, semiconductor devices.

Wafers 2 may be moved from atmosphere to the vacuum environment through the load lock 12 for processing by the process modules 8. It will be understood that, while the following description is generally directed to wafers, a variety of other objects may be handled within the system 1 including a production wafer, a test wafer, a cleaning wafer, a calibration wafer, or the like, as well as other substrates (such as for reticles, magnetic heads, flat panels, and the like), including square or rectangular substrates. All such work pieces that might usefully be processed in a vacuum or other controlled environment are intended to fall within the scope of the term "wafer" as used herein unless a different meaning is explicitly provided or otherwise clear from the context.

The transfer robots 4, which may include robotic arms and the like, move wafers within the vacuum environment such as between process modules, or to and from the load lock 12.

The process modules 8 may include any process modules suitable for use in a semiconductor manufacturing process. In general, a process module 8 includes at least one tool for processing a wafer 2, such as tools for epitaxy, chemical vapor deposition, physical vapor deposition, etching, plasma processing, lithography, plating, cleaning, spin coating, and so forth. In general, the particular tool or tools provided by a module 8 are not important to the systems and methods disclosed herein, except to the extent that particular processes or tools have thermal and/or isolation requirements that constrain or dictate use of bypass thermal adjusters or other wafer handling. Thus, in the following description, references to a tool or process module will be understood to refer to any tool or process module suitable for use in a semiconductor manufacturing process unless a different meaning is explicitly provided or otherwise clear from the context.

A number of buffers 10 may be employed in the system 1 to temporarily store wafers 2, or facilitate transfer of wafers 2 between robots 4. Buffer modules 10 may be placed adjacent to a transfer robot module 4, between two transfer robot modules 4, between a transfer robot module 4 and an EFEM, between a plurality of robots 4 associated with modules, or the like. The buffer module 10 may hold a plurality of wafers 2, and the wafers 2 in the buffer module 10 may be accessed individually or in batches. The buffers 10 may also offer storage for a plurality of wafers 2 by incorporating a work piece elevator, or multi-level shelving (with suitable corresponding robotics). Wafers 2 may undergo a process step while in the buffer module 10, such as heating, cooling, testing, metrology, marking, handling, alignment, or the like. The bypass thermal adjusters described below will generally, although not necessarily, be positioned where buffers 10 would otherwise be used in a semiconductor manufacturing process.

The load lock 12 permits movement of wafers 2 into and out of the vacuum environment. In general, a vacuum system evacuates the load lock 12 before opening to a vacuum environment in the interior of the system, and vents the load lock 12 before opening to an exterior environment such as the atmosphere. The system 1 may include a number of load-locks at different locations, such as at the front of the system, back of the system, middle of the system, and the like. There may be a number of load-locks 12 associated with one location within the system, such as multiple load-locks 12 located at the front of the linear processing system. In addition, front end load-locks 12 may have a dedicated robot and isolation valve associated with them for machine assisted loading and unloading of the system. These systems, which may include equipment front-end modules (EFEM), front opening unified pods (FOUPs), and the like, are used to control wafer movement of wafers into and out of the vacuum processing environment.

The isolation valves 14 are generally employed to isolate process modules during processing, or to otherwise isolate a portion of the vacuum environment from other interior regions. Isolation valves 14 may be placed between other components to temporarily isolate the environments of the system 1, such as at one or more entries to the bypass thermal adjusters described below. An isolation valve 14 may open and close, and provide a vacuum seal when closed.

Other components may be included in the system 1. For example, the system 1 may include a scanning electron microscope module, an ion implantation module, a flow through module, a multifunction module, a vacuum extension module, a storage module, a transfer module, a metrology module, a heating or cooling station, or any other process module or the like. In addition these modules may be vertically stacked, such as two load-locks stacked one on top of the other, two process modules stacked one on top of the other, or the like.

It will be understood that, while FIG. 1 shows a particular arrangement of modules and so forth, that numerous combinations of process modules, robots, load locks, buffers, and the like may suitably be employed in a semiconductor manufacturing process, and that a thermal bypass adjuster may be usefully employed at a variety of locations therein. The components of the system 1 may be changed, varied, and configured in numerous ways to accommodate different semiconductor processing schemes and customized to adapt to a unique function or group of functions. All such arrangements are intended to fall within this description.

It is frequently desirable to heat or cool wafers between process steps of a semiconductor manufacturing process. It may also be desirable to simultaneously allow other wafers to pass by the wafer being heated or cooled. Since cooling or heating a wafer may take approximately twenty to sixty or more seconds, it may also be advantageous to facilitate the transfer of other wafers so that the cooling or heating does not block wafer flow. A vacuum module in which wafers can be exchanged between robots while facilitating temperature adjustment of another wafer may improve the flexibility and efficiency of semiconductor processing systems.

Such a vacuum module may include an environmentally sealable enclosure to capture and thermally adjust a wafer in transition before the wafer is transferred to the next process step, while allowing coordinated pass through of other wafers during the heating or cooling process.

It may be advantageous to include such a vacuum module in close proximity to a process chamber in a vacuum semiconductor processing system, such that a wafer may be heated or cooled to meet the particular needs of the process chamber for improved processing. Additionally, including and utilizing such a vacuum module can facilitate effective use of process chambers in the system by allowing a second wafer to be brought up to temperature as a first wafer is being processed.

Additionally, a wafer may be returned to ambient temperature immediately after it is taken from a process chamber, before it is handled by additional transfer robots, thereby eliminating or reducing wait times associated with thermal adjustment.

Figure 2:
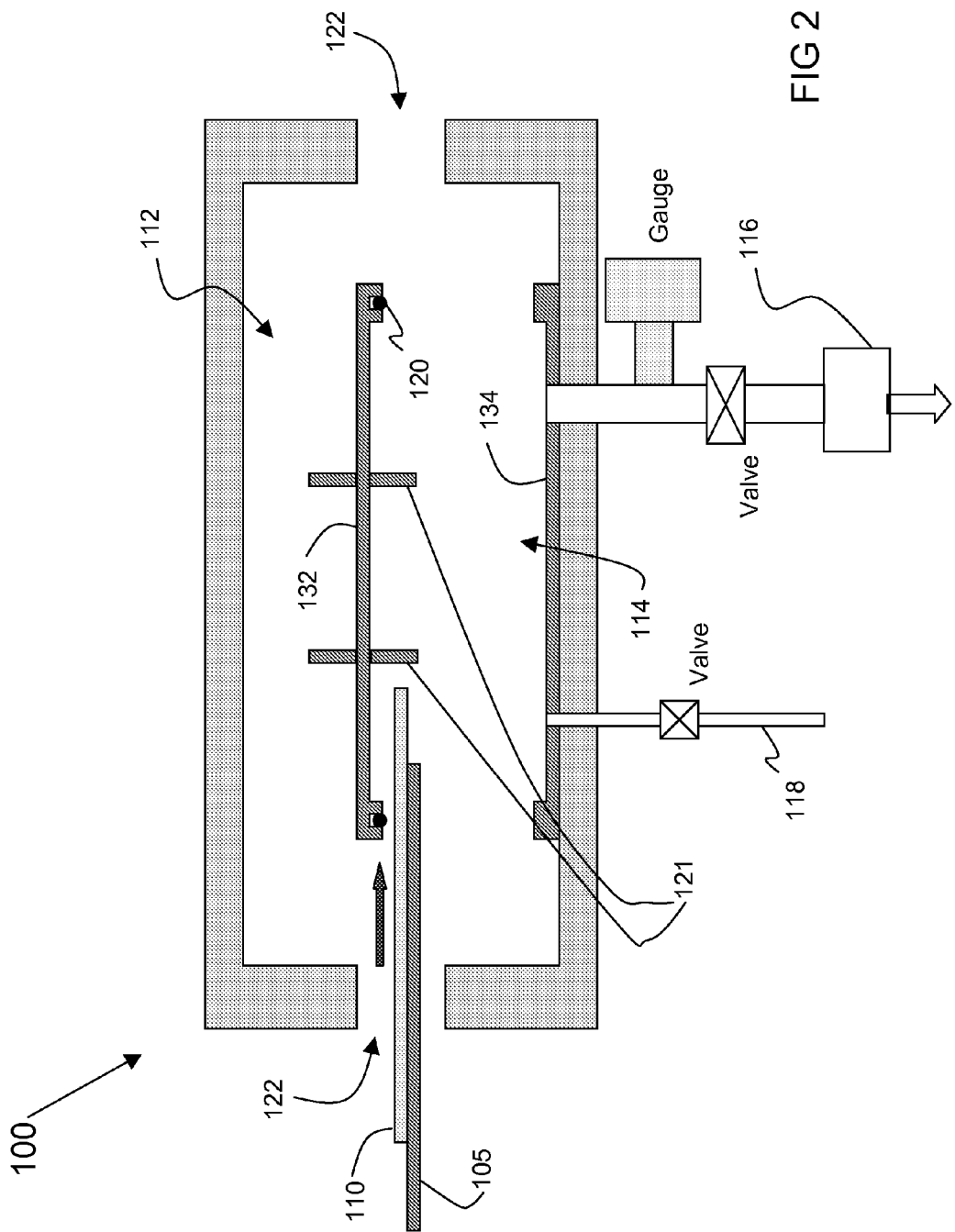
FIG. 2 is depicts a work piece being transferred by a flexible transfer robot for thermal adjustment.

Referring to FIG. 2, an embodiment of a bypass thermal adjuster is shown including an upper half 132 and a lower half 134 inside a vacuum module 100. In general, the upper half 132 and the lower half 134 collectively form a sealable enclosure that can selectively isolate a portion of the environment within the interior of the vacuum module 100. The vacuum module 100 may be a buffer 10 between semiconductor manufacturing robotic handlers, process modules, load locks, or any other hardware where wafers 110 may be transferred or moved within a system. Using the bypass thermal adjuster, a wafer 110 may be enclosed in an environment isolated from a remaining interior 112 of the vacuum module 100 to be heated or cooled for a next workstation while another wafer may pass through the vacuum module 100 to a workstation. In addition to heating or cooling, the interior 114 of the bypass thermal adjuster, when in isolation, may use a vacuum pump 116 to control pressure in the interior 114 independently from the remaining interior 112 of the vacuum module 100. In addition, using a gas supply 118 such as a supply of Argon, a gas may be supplied to the bypass vacuum interior 114 to optimize the heating and cooling rates of the wafer 110 within the bypass thermal adjuster. In other embodiments, the bypass thermal adjuster may provide localized heating and/or vertical lift control without isolation. So for example, the upper half 132 may receive the wafer 110, lower the wafer 110 out of the path of wafers through the vacuum module 100 onto a direct heating surface or the like, heat, cool, or otherwise control heat of the wafer 110, and then raise the wafer for retrieval by the same or a different robot, all without isolating the wafer environment from the remaining interior of the vacuum module 100.

As shown in FIG. 2, the flexible transfer robot 105 is transferring a wafer 110 into the bypass thermal adjuster for purposes of thermally adjusting the wafer 110. The bypass thermal adjuster upper half 132 is shown in the open position allowing the flexible transfer robot 105 to place the wafer 110 onto a set of support clips 120 that are associated with the bypass thermal adapter upper half 132. Although not visible in the side view of FIG. 2, it will be understood that each support clip 120 may include an "L" shaped or other finger or protuberance upon which an edge of the wafer 110 may be placed, so that a group of suitably positioned support clips 120 can support the wafer 110 around its perimeter. As shown, the bypass thermal adjuster upper half 132 contains a sealing facility 121 to form a seal with the bypass thermal adjuster lower half 134, providing for separate enclosure and isolation of the wafer 110 from the remaining interior 112 of the vacuum module 100. It should be understood that the sealing facility may be any type of sealing facility that provides for sealing the two halves of the bypass thermal adjuster. It should also be understood that the sealing facility may be on the bypass thermal adjuster upper half 132, on the bypass thermal adjuster lower half 134, or a combination of these.

Although not depicted, the vacuum module 100 may include an isolation valve or the like at each entry thereto to permit isolation of the interior 112. At the same time, it will be understood that a wafer 110 sealed within the adjuster interior 114 may be isolated without requiring isolation valves for the vacuum module 100 to be closed.

Figure 3:
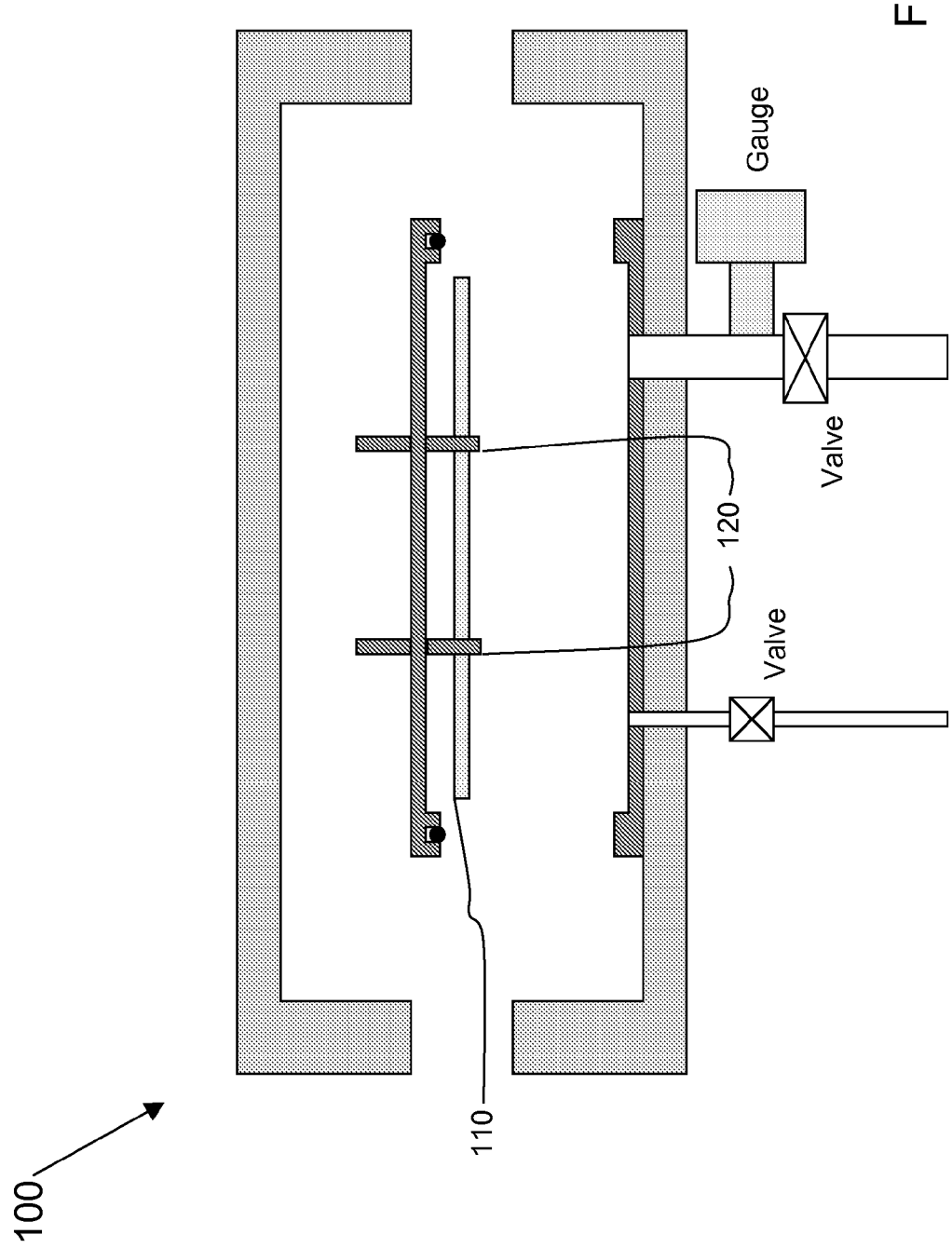
FIG. 3 depicts a work piece in position in a thermal adjustment enclosure right after the transfer robot has placed the work piece in the enclosure.

Referring to FIG. 3, the wafer 110 is shown being supported by the support clips 120 after the flexible transfer robot (not shown) has been retracted. Once the support clips 120 fully engage the wafer 110, the robot may release the wafer 110 and retract out of the module 110.

Figure 4:
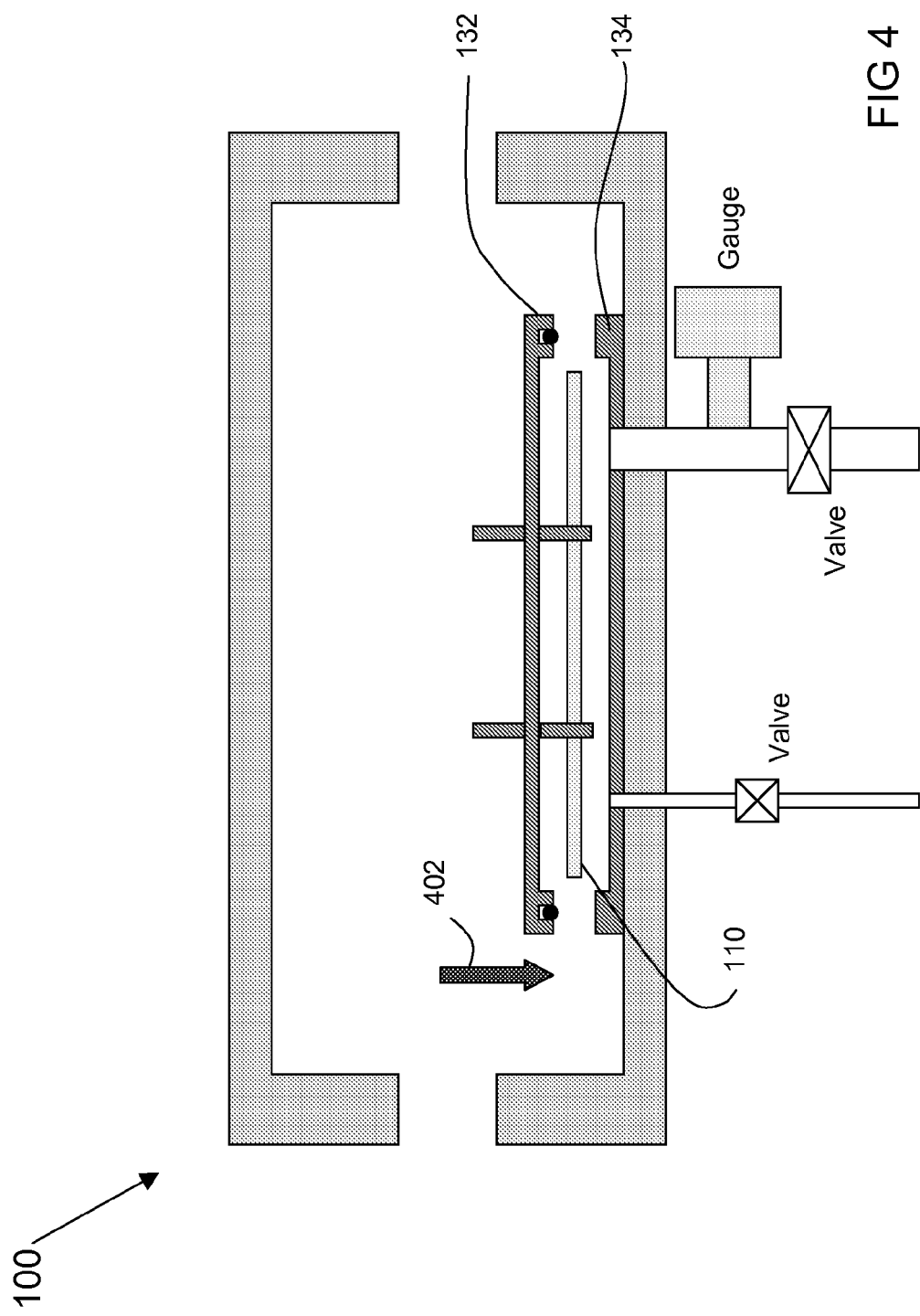
FIG. 4 depicts a thermal adjustment enclosure closing to fully encapsulate a work piece.

Referring to FIG. 4, the bypass thermal adjuster top half 132 is shown lowering (in the direction of an arrow 402) to make contact with the bypass thermal adjuster bottom half 134 creating an isolation enclosure that encapsulates the wafer 110.

Figure 5:
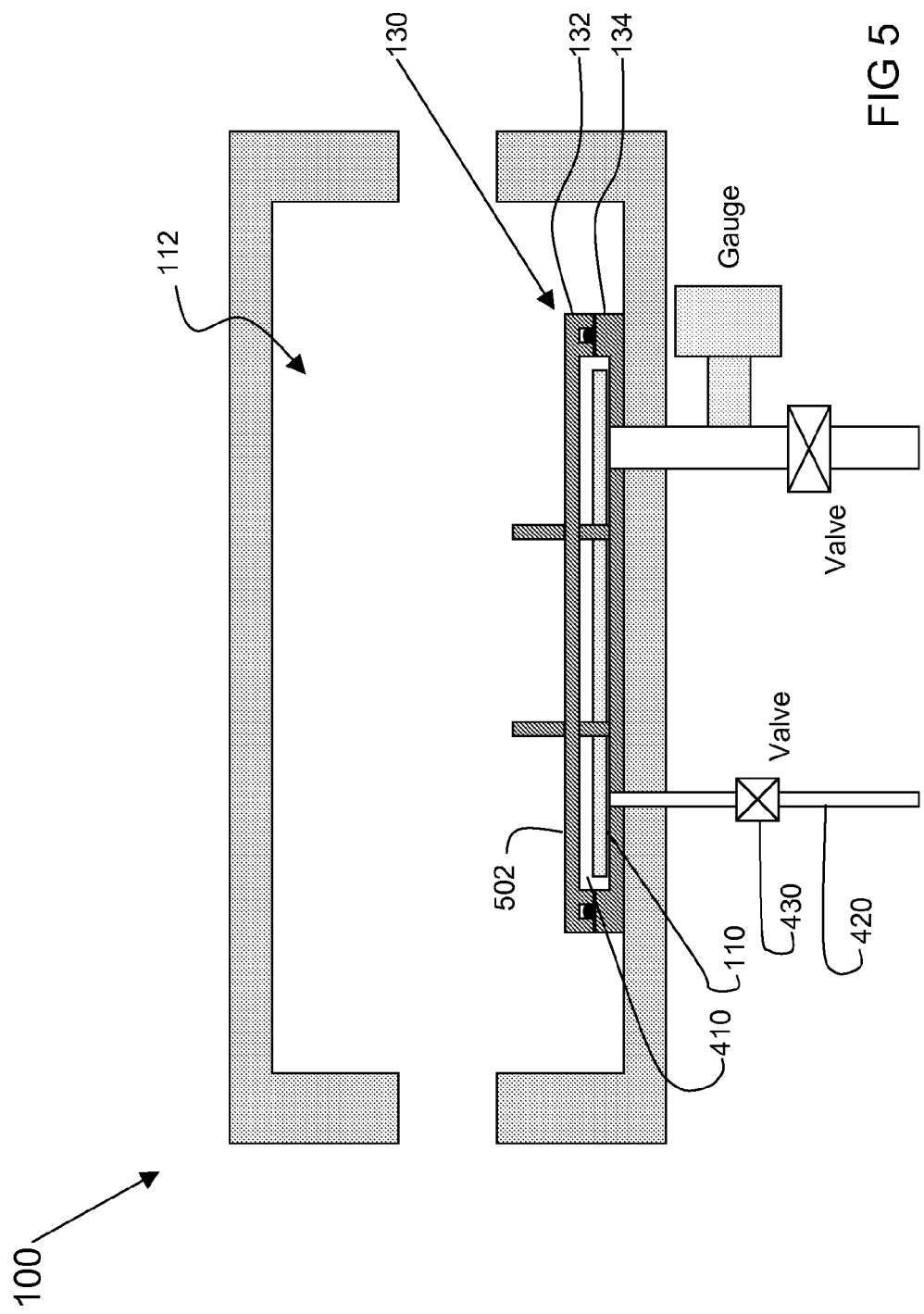
FIG. 5 shows an inert gas pressurizing the thermal adjustment enclosure.

FIG. 5 depicts the fully closed bypass thermal adjuster 130 creating an enclosure that is isolated from the remaining interior 112 of the vacuum module 100. Once the bypass thermal adjuster 130 is fully closed and sealed, the environment within the bypass thermal adjuster 130 may be modified to heat or cool the wafer 110.

In embodiments, the environment of the bypass thermal adjuster 130 may be modified by changing the vacuum within the bypass thermal adjuster 130, adding a gas to the enclosure 410, heating the enclosure, cooling the enclosure, or the like; the environment modifications may be applied individually or in combination, either simultaneously, serially, or some combination of these. The thermal modification made to the wafer 110 may depend on subsequent process steps. For example, the wafer 110 may have just completed a process that required a high temperature and the next process step may require a cooler wafer temperature. Cooling the wafer may need to be at a controlled rate to avoid contamination of the wafer 110, such as from water condensation, or physical damage. The wafer 110 may be cooled (or heated) at a controlled rate within the bypass thermal adjuster without having to change the environment of an entire vacuum module 100, therefore providing for the temperature control of the wafer 110 while allowing additional wafers to pass through the vacuum module 100. In order to optimize the rate of the wafer 110 temperature change within the bypass thermal adjuster 130, it may be advantageous to introduce a gas into the bypass thermal adjuster 130 enclosure to an internal pressure of approximately 1 to 5 Torr. In an embodiment, the gas may be argon, helium, nitrogen, or other similar gas.

Once the environment has been adjusted, including the desired gas pressure, the wafer 110 may be heated or cooled to the desired temperature by heating or cooling the bypass thermal adjuster 130. In embodiments there may be thermal control devices 502, such as heating and/or cooling elements within the bypass thermal adjuster top half 132 and/or the bypass thermal adjuster bottom half 134 to provide the heating or cooling required. In embodiments, when positioned within the bypass thermal adjuster, the wafer 110 may be in contact with the bypass thermal adjuster lower half 134, may be in contact with the bypass thermal adjuster top half 132, or may be positioned between the two bypass thermal adjuster halves (132 134). With the wafer 110 in contact with the bypass thermal adjuster halves (132 134), the wafer 110 may be directly heated or cooled by the bypass thermal adjuster halves (132 134). With the wafer positioned between the bypass thermal adjuster halves (132 134), the bypass thermal adjuster 130 environmental gas may be heated or cooled by the bypass thermal adjuster halves (132 134) and the wafer 110 may be heated or cooled by conduction. Heating or cooling of the wafer 110 may continue until the wafer 110 is substantially the same as the temperature of the bypass thermal adjuster 130. Once the wafer 110 has reached the desired temperature, the bypass thermal adjuster environment may be adjusted to match the environment of the vacuum module 100 by pumping out any environmental gasses and substantially matching the vacuum level between the bypass thermal adjuster 130 and the vacuum module 100.

It will be understood that many heating and cooling techniques are known in the art, and may be suitably adapted for use as a thermal management system with the bypass thermal adjuster described herein. This includes gas-based thermal control (such as described above), electrical thermal control, fluid-based thermal control, and other techniques such as induction or microwave heating that might suitably be used to either directly heat/cool a wafer, or to heat/cool fluids or gasses placed in contact or near contact with wafers. Further, thermal control may generally be administered through radiation, convection, or conduction. It will further be understood that a thermal management system used by the bypass thermal adjuster may include temperature sensors, one or more controllers, valves, gauges, and any other suitable hardware, according to the particular thermal management technique(s) employed. All such variations as would be apparent to one of ordinary skill in the art are intended to fall within the scope of this disclosure.

Similarly, a vacuum management system for control the vacuum of the interior of the thermal bypass adjuster may use any techniques know to those of ordinary skill in the art, and may include gauges, vacuum pumps, gas supplies, and so forth. The vacuum management system may also or instead control gas supply to the interior to control the environment within the sealed bypass thermal adjuster.

Figure 6:
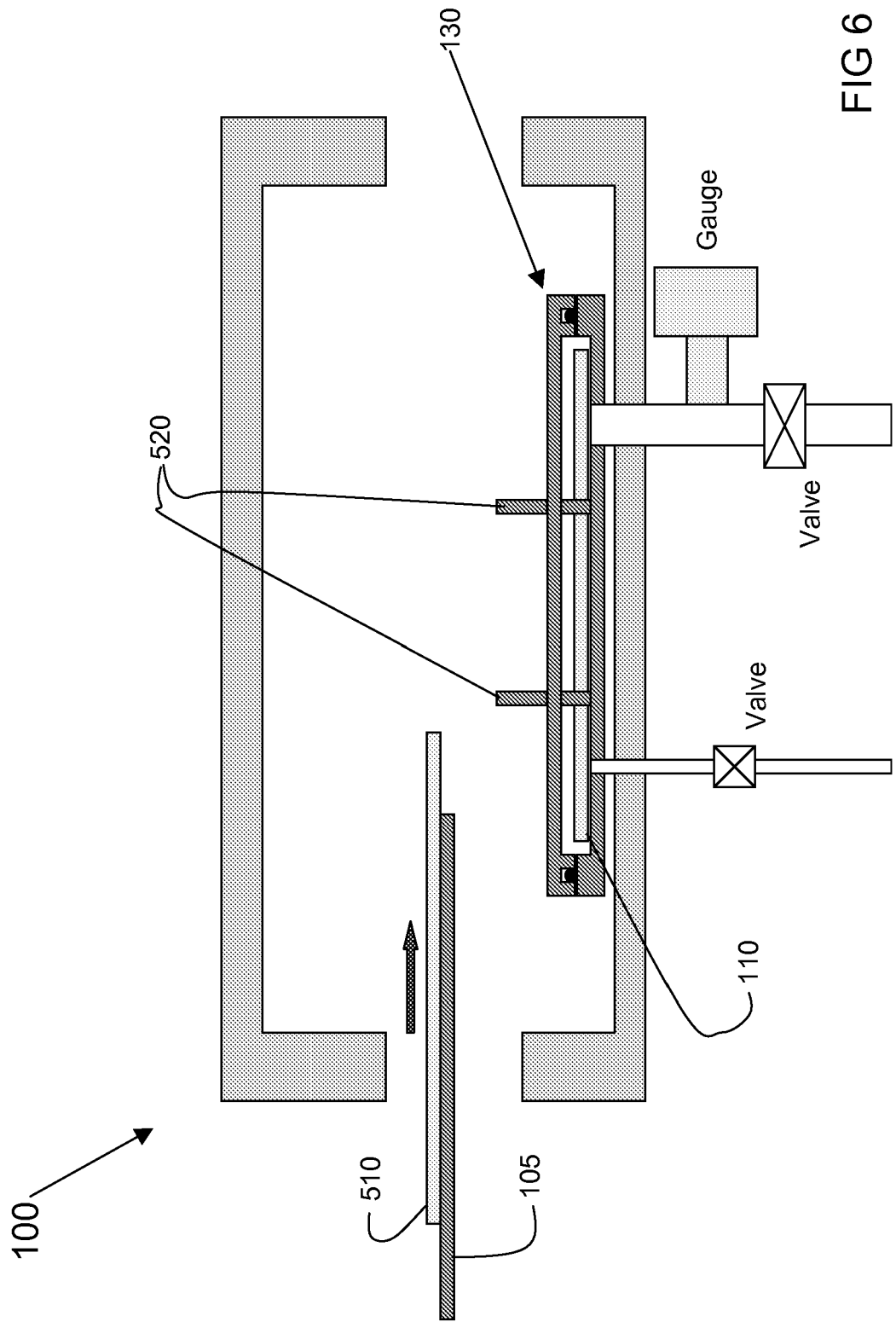
FIG. 6 is a side view showing a second work piece being loaded into the vacuum module.

Referring to FIG. 6, another aspect of the bypass thermal adjuster 130 is shown. In an embodiment, a second set of support clips 520 may be mounted on the bypass thermal adjuster top half 132 and may be used to support a second wafer 510 while the first wafer 110 is being cooled or heated inside the enclosure 130. As shown in FIG. 6, the robot 105 may transfer the second wafer 510 to the second support clips 520. In another embodiment, the second set of support clips 520 may be mounted on a side wall of the vacuum module 100.

Figure 7:
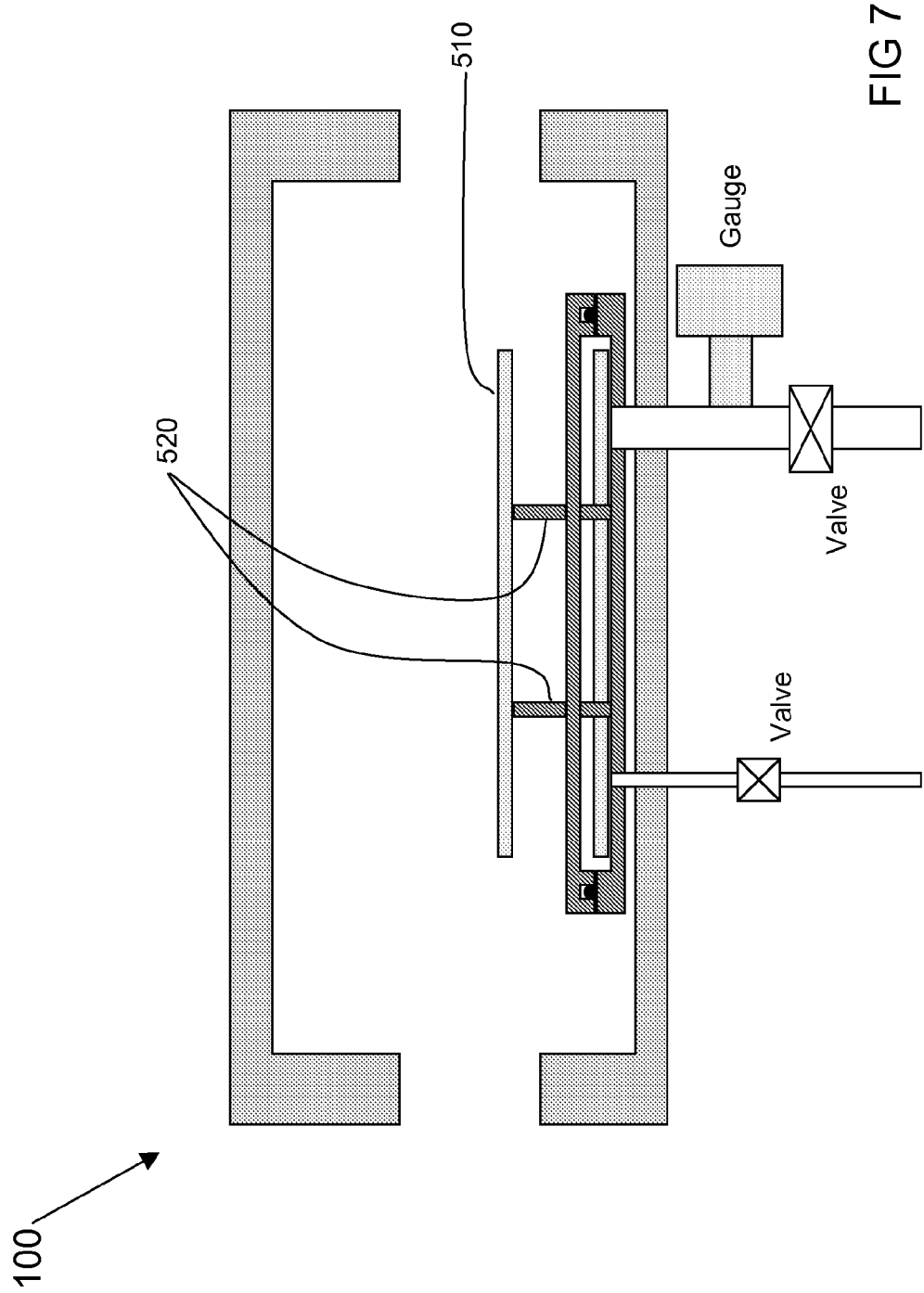
FIG. 7 shows the second work piece positioned in the vacuum module.

Referring to FIG. 7, the second wafer 510 is held in position by the second set of support clips 520 after the transfer robot (not shown in this view) has placed the second wafer 510 on the second set of support clips 520. In this view, it is shown that the first wafer 110 may be in a first environment within the bypass thermal adjuster 130 while the second wafer 510 is in a second environment within the vacuum module 100. This may allow the first wafer to be prepared for transfer to a work station, process module, or the like (by either heating or cooling) while the second wafer 510 is able to simultaneously pass through the vacuum module 100 in a separate wafer work flow. As depicted in FIG. 7, the second wafer 510 may be held by second support clips 520 temporarily, freeing up the transfer robot 105 until a second robot (not shown) is available to accept the second wafer 510, such as from the other entry to the vacuum module 100.

Figure 8:
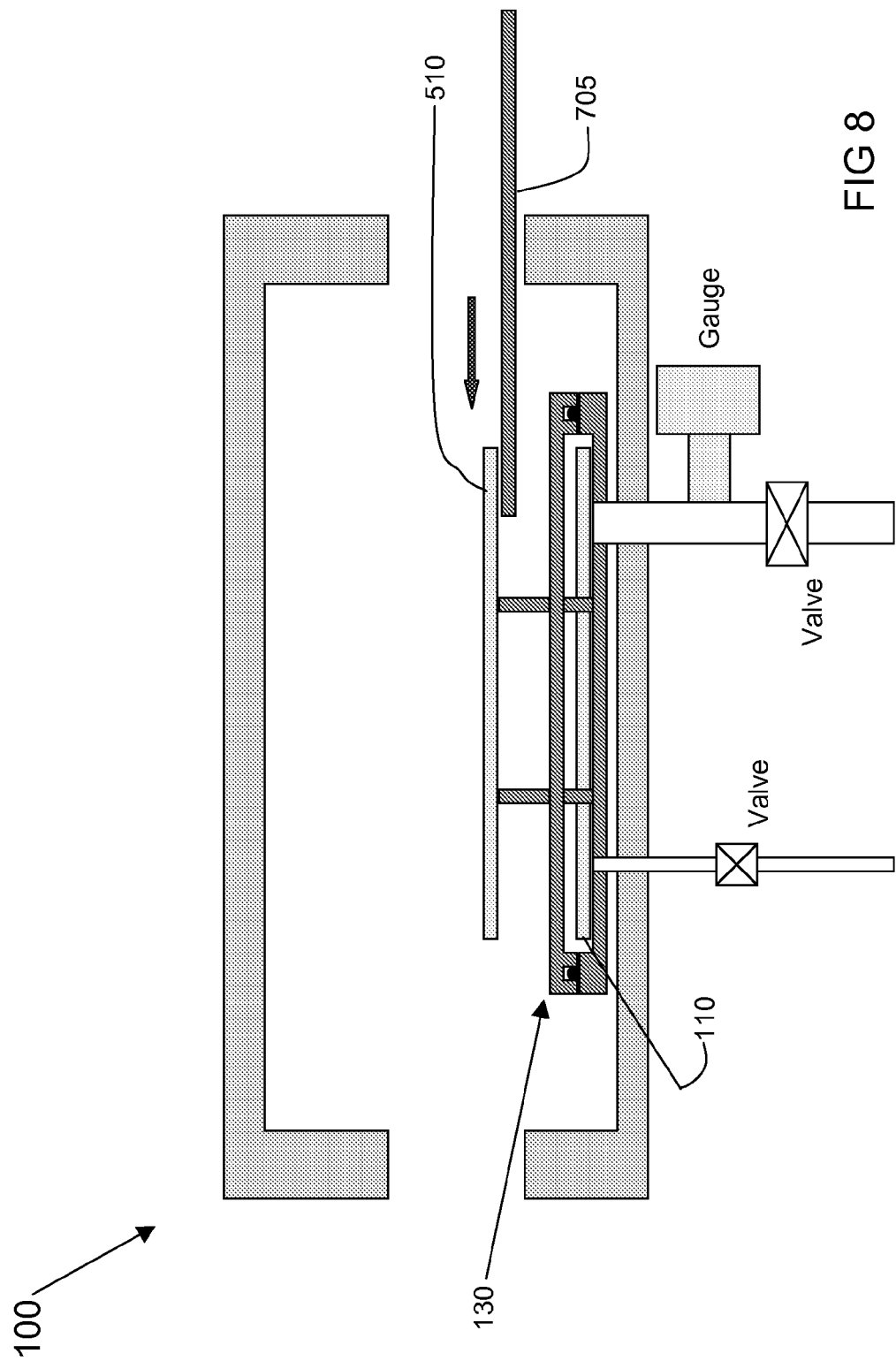
FIG. 8 shows an alternate transfer robot removing the second work piece from the vacuum module.

Referring to FIG. 8, a second transfer robot 705 removing the second wafer 510 from the second support clips 520 is shown. During this time, first wafer 110 may remain in enclosure 130 under thermal management. It should be understood that the first wafer 110 may be held within the bypass thermal adjuster for longer than the required time to achieve a target temperature, for example when other wafers are passing through the vacuum module 100 or while waiting for a particular tool or process module to become available.

Figure 9:
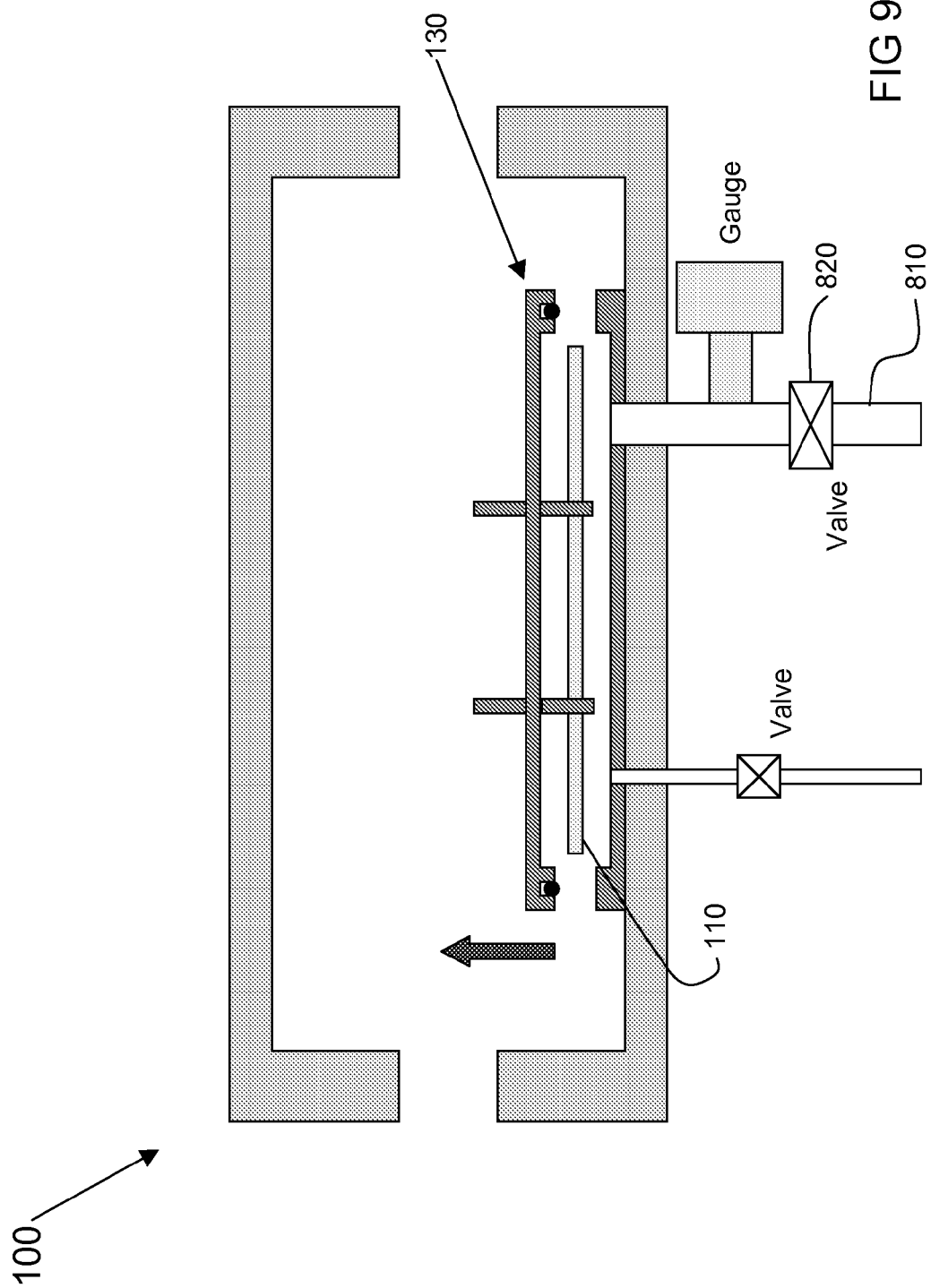
FIG. 9 shows the thermal adjustment enclosure opening after the gas has been removed and the work piece has reached a desired temperature.

Referring to FIG. 9, the bypass thermal adjuster 130 is shown opening after the wafer 110 has reached a desired temperature, the contact gas 410 (not shown) may have been removed through pump line 810 and valve 820, and the interior of the bypass thermal adjuster 130 may be substantially returned to the same vacuum environment within the vacuum module 100.

Figure 10:
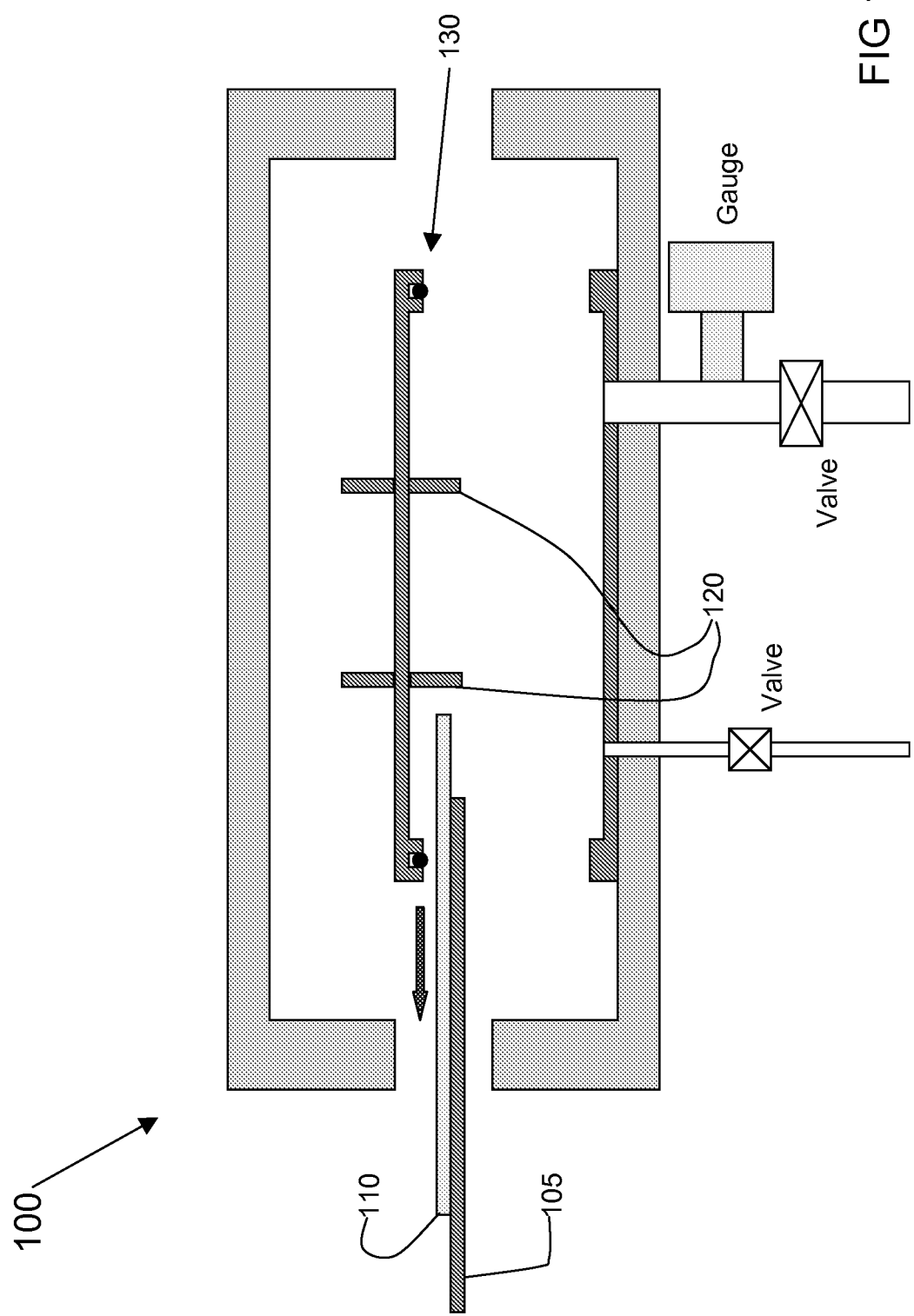
FIG. 10 shows an enclosure fully open and a robot removing the thermally adjusted work piece.

FIG. 10 shows the bypass thermal adjuster 130 fully open and the robot 105 removing the wafer 110 from the support clips 120 completing the cycle of heating or cooling the wafer 110. It should be understood, that while the first wafer 110 is heated or cooled within the bypass thermal adjuster 130, more than one additional wafer may pass through the vacuum module 100. Additionally, it should be understood that the wafer 110 is shown being removed from the same direction from which it entered, but the wafer 110 may be removed in any other available direction.

Figure 11:
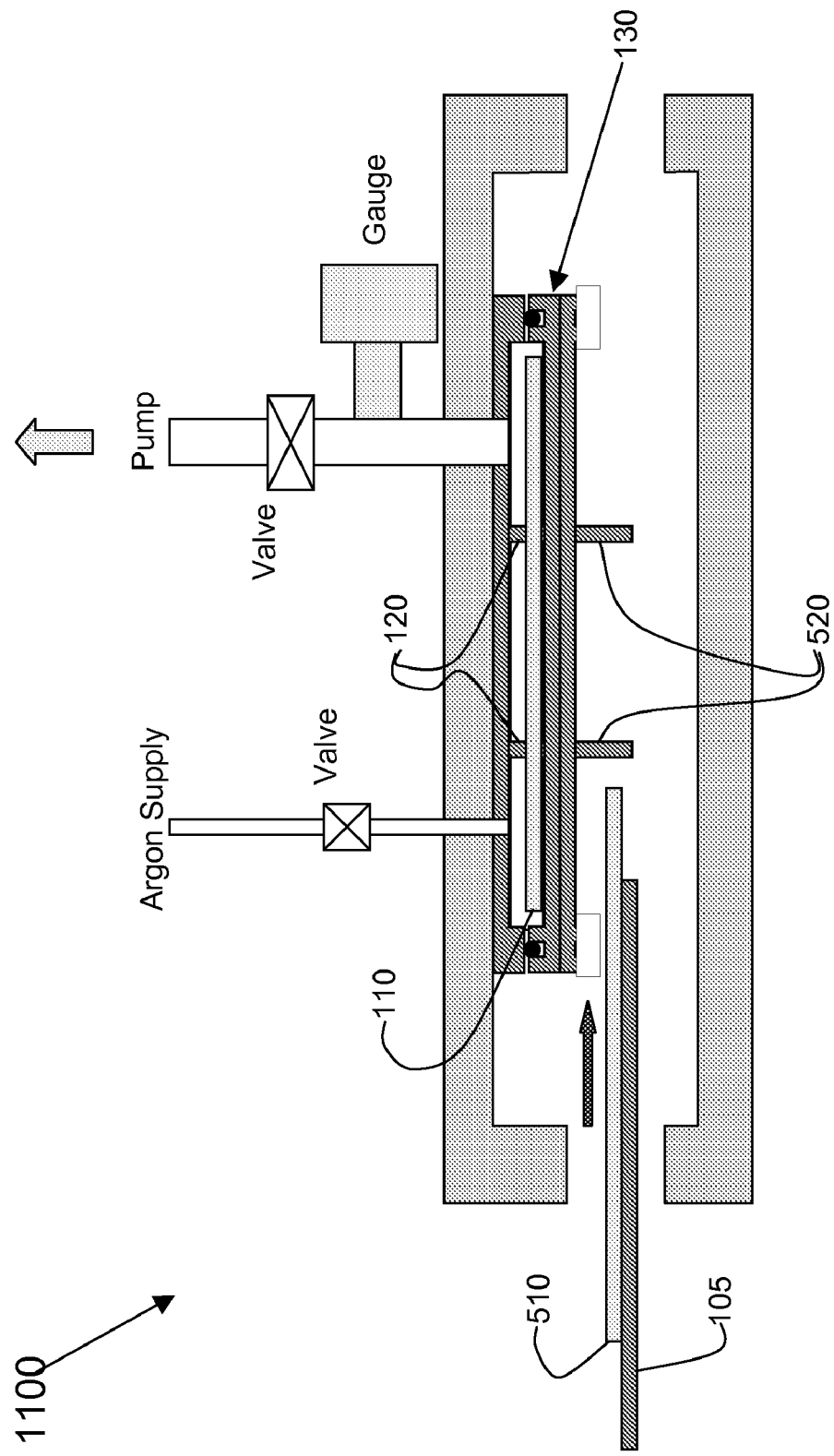
FIG. 11 shows an alternate configuration of the thermal adjustment enclosure.

Referring to FIG. 11, one alternate configuration of the bypass thermal adjuster 130 is shown with the bypass thermal adjuster top half 132 fixed to the vacuum module 1100 interior and bypass thermal adjuster bottom half 134 moveable to open and close the bypass thermal adjuster 130. As in the previous configuration, the bypass thermal adjuster top half 132 or bottom half 134 may provide the heating and cooling of the wafer 110. As shown, in a previous step, the transfer robot 105 placed the first wafer 110 on the support clips 120 and retreated prior to the bypass thermal adjuster bottom half 134 raising up to environmentally enclose the wafer 110 for thermal adjustment. The transfer robot 105 is shown transferring the second wafer 510 to the second clips 520 as a pass through wafer. Placing or retrieving the second wafer 510 may be performed while the bypass thermal adjuster 130 is fully closed.

Figure 12:
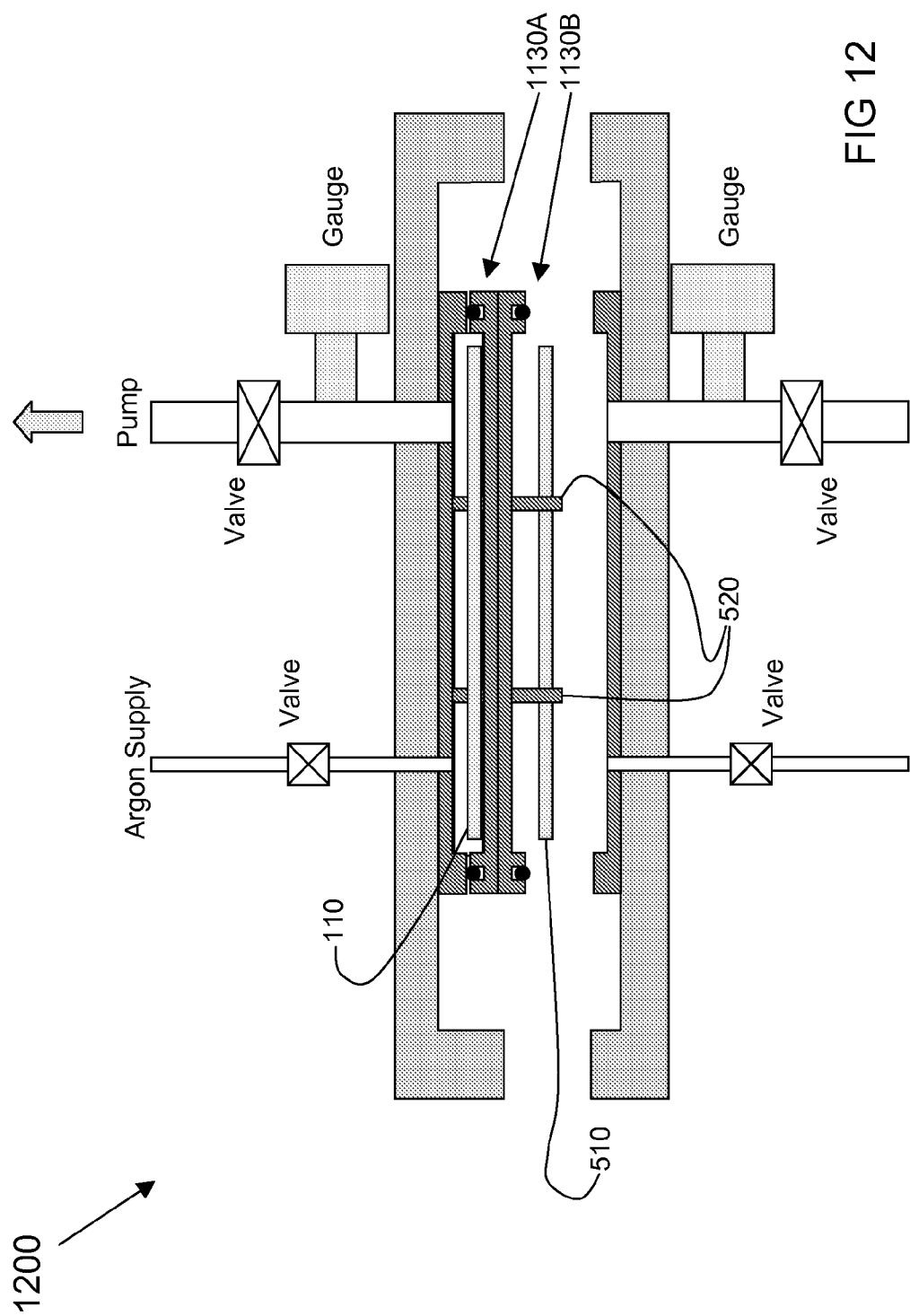
FIG. 12 shows two thermal adjustment enclosures in a single vacuum module.

FIG. 12 depicts a vacuum module 1200 including dual bypass thermal adjusters 1130A and 1130B. These adjusters are vertically stacked with one directly above the other. An upper bypass thermal adjuster 1130A is shown closed and containing the first wafer 110, while lower bypass thermal adjuster 1130B is shown open with the second wafer 510 being supported by the second support clips 520. The second wafer 510 may be ready for thermal adjustment, may be ready to be retrieved by a transfer robot after it has completed thermal adjustment, or may not require thermal adjustment and is being transferred through the vacuum module 1300. In this configuration, wafers (110, 510) may be adjusted to different temperatures in the different bypass thermal adjusters (1130A, 1130B), both bypass thermal adjusters (1130A, 1130B) may adjust to the same temperatures, or the bypass thermal adjusters (1130A, 1130B) may adjust the temperatures differently with each wafer (110, 510) based on the requirements of the semiconductor manufacturing process. In this configuration, the vacuum module 1300 may be a buffer module and may provide access to more than one semiconductor process module where each semiconductor process module requires different wafer temperatures.

Figure 13:
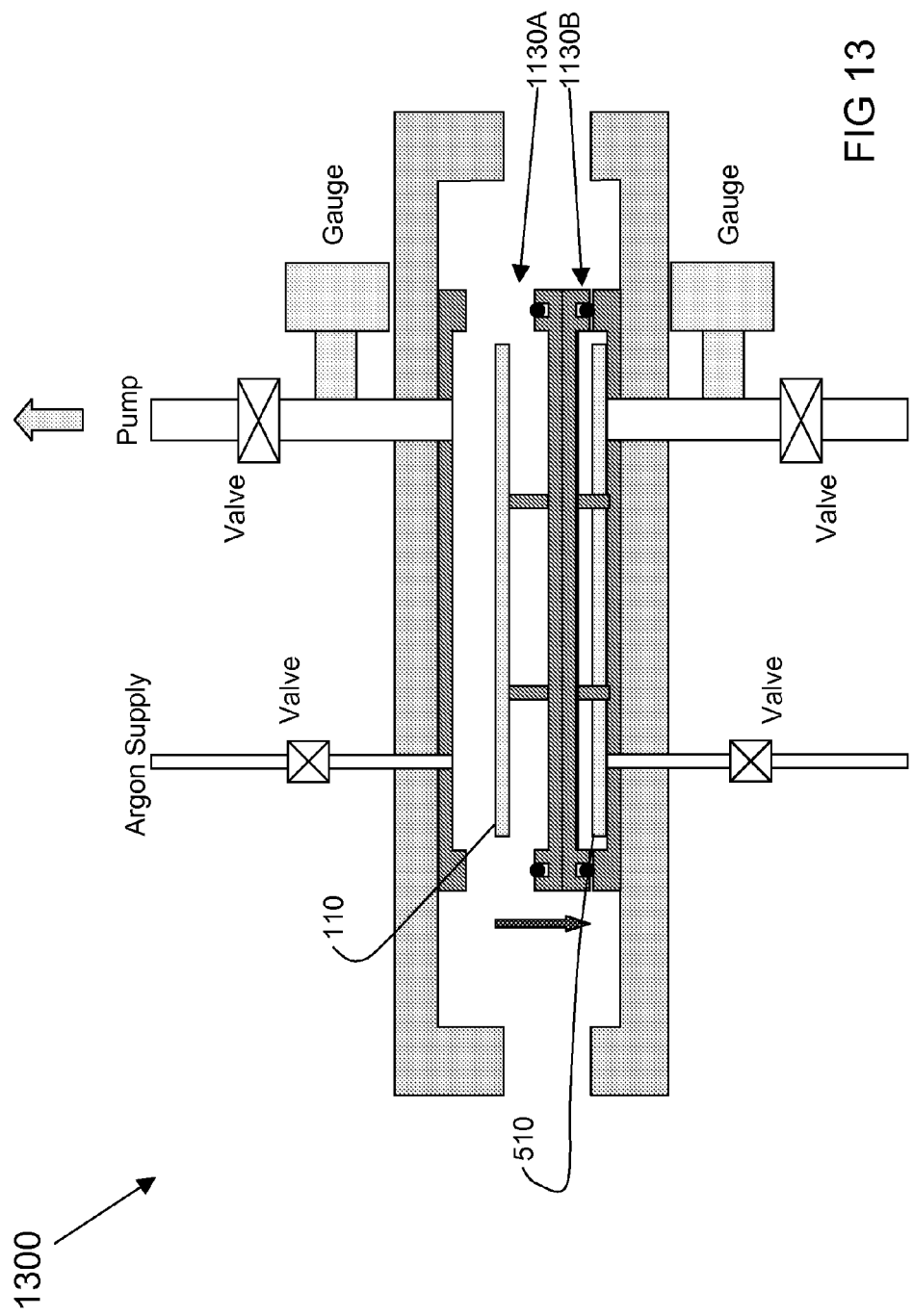
FIG. 13 shows the embodiment depicted in FIG. 12 in which the lower thermal adjustment enclosure is closing while an upper thermal adjustment enclosure opens.

FIG. 13 shows the same configuration as FIG. 12 but with the upper bypass thermal adjuster 1130A open and lower bypass thermal adjuster 1130B closed. This configuration may result from first wafer 110 having completed thermal adjustment and second wafer 510 undergoing thermal adjustment. Alternatively, first wafer 110 may be recently placed by a transfer robot and is ready for thermal adjustment pending the completion of the thermal adjustment of second wafer 510. In FIG. 12 and FIG. 13 the bypass thermal adjusters (1130A and 1130B) are shown working in concert, but it should be understood that the two bypass thermal adjusters (1130A, 1130B) may be adapted to work independently from each other such that each may be closed at the same time, each may be open at the same time, one may be open while the other is closed, or the like. Each of the bypass thermal adjusters may also be used for pass through wafers such that the wafer may be placed on one of the support clips within the bypass thermal adjuster (1130A, 1130B) and not processed within the bypass thermal adjuster (1130A, 1130B).

Figure 14:
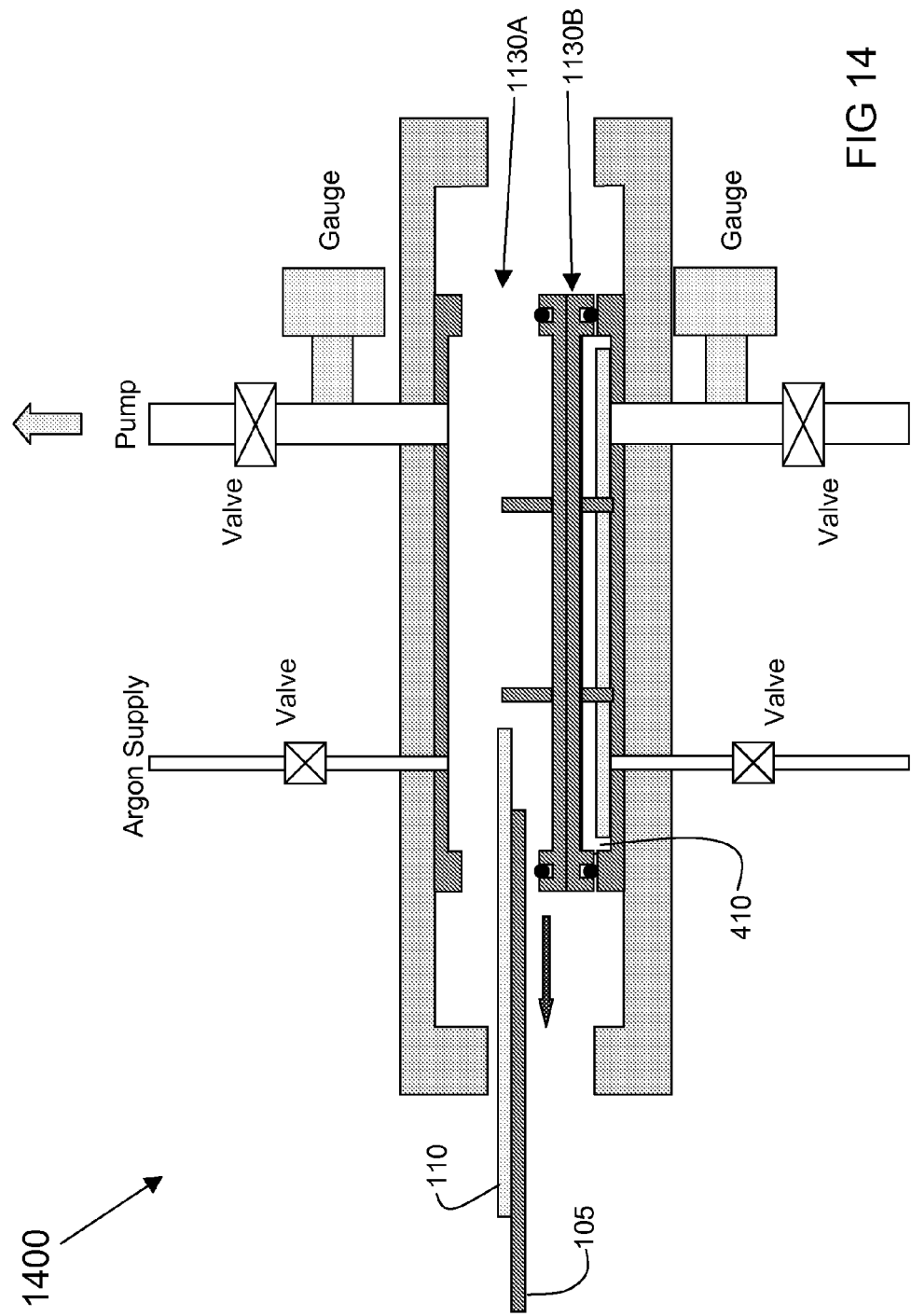
FIG. 14 shows the lower enclosure being gassed while the work piece from the upper enclosure is removed by a robot.

FIG. 14 shows the same configuration as FIG. 12 and FIG. 13 with bypass thermal adjuster 1130B being pressurized by the gas 410 while the transfer robot 105 is retrieving the first wafer 110 from the upper bypass thermal adjuster 1130A, and transferring the wafer 110 out of the vacuum module 100.

Figure 15:
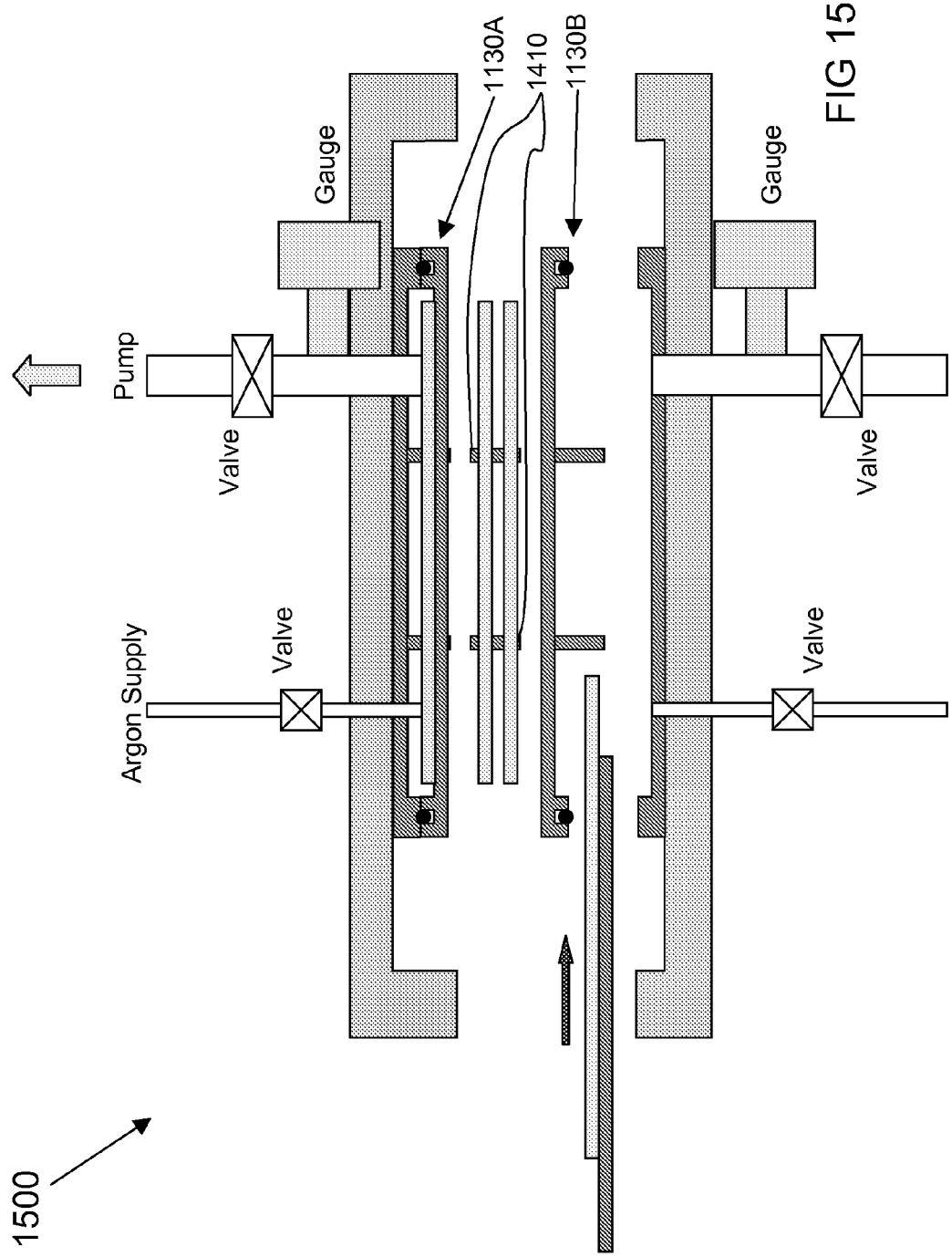
FIG. 15 shows an alternate configuration of dual independent thermal adjustment enclosures with work piece storage between the enclosures.

FIG. 15 shows another configuration of the vacuum module 1400 that includes dual bypass thermal adjusters (1130A, 1130B) and an intermediate wafer storage 1410. The intermediate wafer storage 1410 may facilitate flexibility in scheduling the handling of wafers within the vacuum environment by allowing one or more wafer to pass through the vacuum module 1400 while one or more wafer may be thermal treated within the bypass thermal adjusters (1130A, 1130B). In an embodiment, depending on the volume of the vacuum module, the intermediate wafer storage 1410 may store a plurality of pass through wafers. Intermediate wafer storage 1410, such as that shown in FIG. 15 may also allow for load balancing of a process group.

FIGS. 16 through 19 show phases of operation of another alternate embodiment of bypass thermal adjuster 1630. The shown bypass thermal adjuster 1630 is different from the earlier depicted bypass thermal adjuster 130 by having a fixed top half 132 and fixed bottom half 134. Environmental isolation from the vacuum module 1400 environment may be provided by moving slot valves 1610 to form an environmental seal between the bypass thermal adjuster 1630 top half and bottom half.

In addition to moving slot valves 1610, moveable support clips 1620 may be included in the interior 1640 of bypass thermal adjuster 1630 for lowering wafer 110 into the desired position within the bypass thermal adjuster 1630.

The slot valves 1610 may provide an advantage of lower cost relative to providing mechanisms for either of the bypass thermal adjuster halves to move up and down. Additionally, since the bypass thermal adjuster 1630 top half is stationary, there is no need to coordinate the transfer robot 105 accessing the exterior support clips 520 with the thermal adjustment operation of bypass thermal adjuster 1630 since the support clips 520 have a fixed location. The fixed positioned exterior support clips 520 may allow the second wafer 510 to pass through the vacuum module 100 using the fixed exterior support clips 520 while the first wafer 110 is in the process of positioning within the bypass thermal adjuster 1630.

Figure 16:
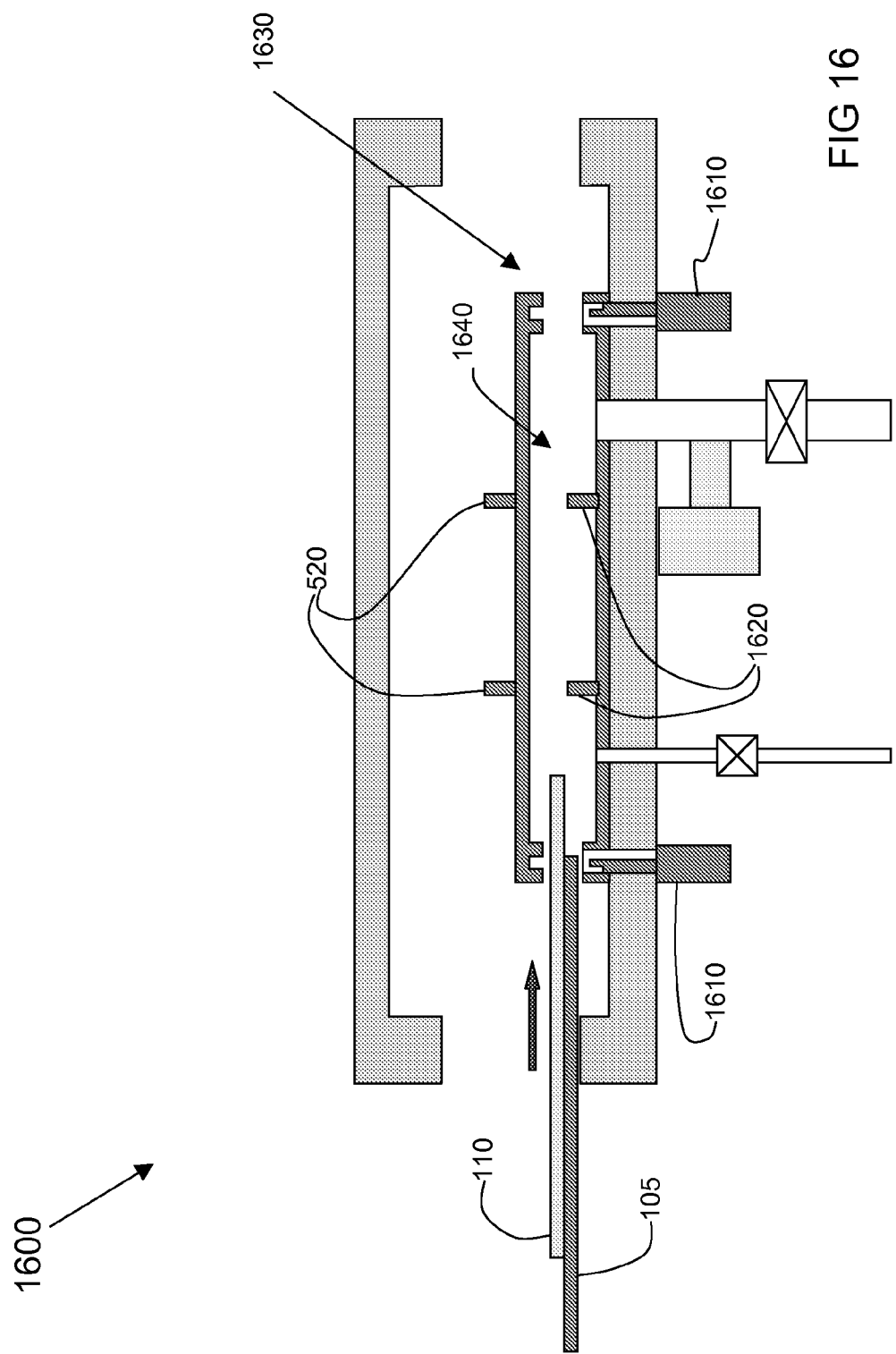
FIG. 16 shows an alternate way of closing the thermal adjustment enclosure without moving the enclosure top or bottom.

FIG. 16 further shows the transfer robot 105 loading the first wafer 110 into the bypass thermal adjuster 1630 with the moving slot valves 1610 in the open position.

Figure 17:
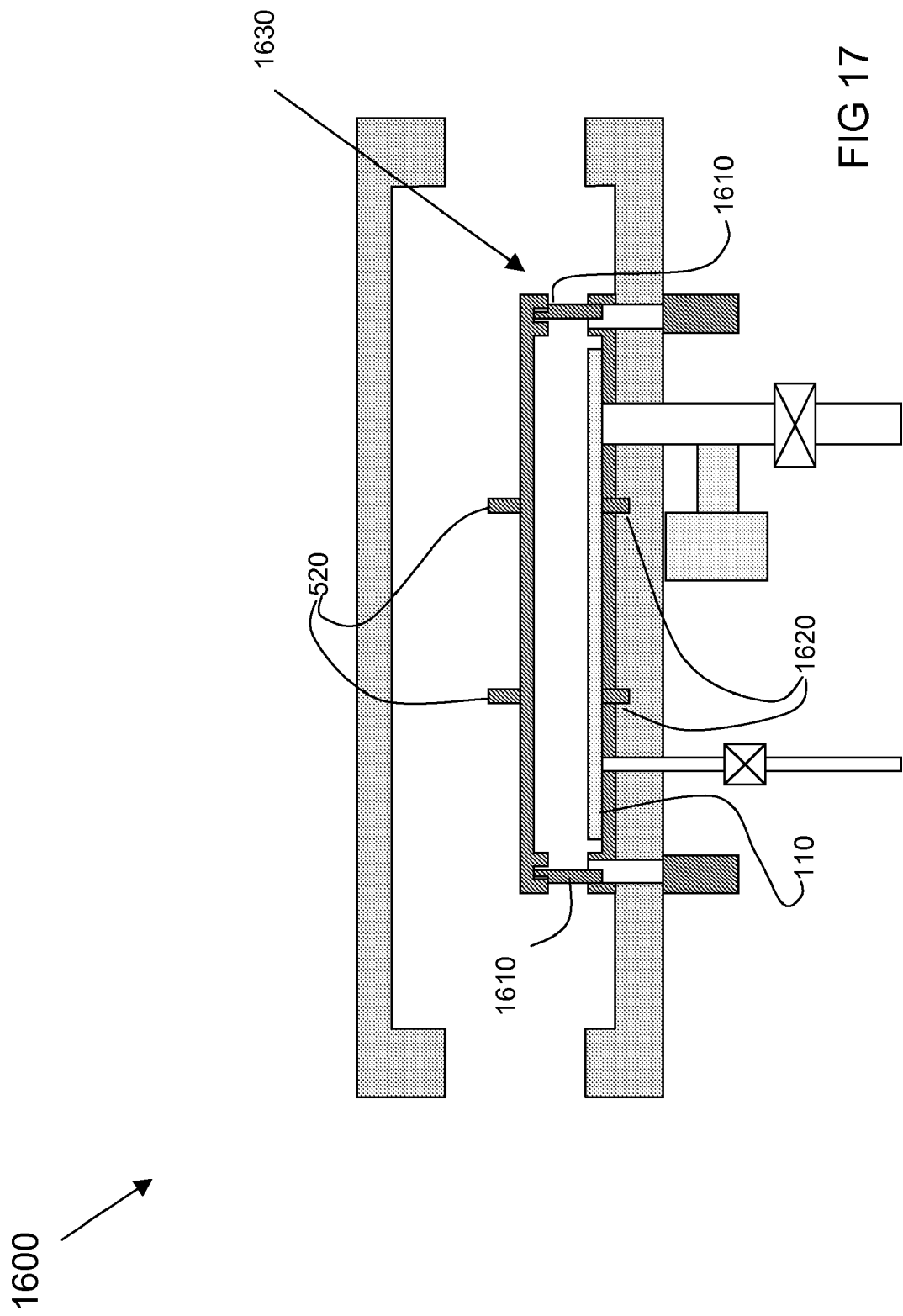
FIG. 17 shows the embodiment of FIG. 16 with slot valves closed, a work piece in contact with the lower surface, and a gas supply system filling the enclosure.

FIG. 17 shows the moving slot valves 1610 the closed position and the bypass thermal adjuster 1630 pressurized for thermally adjusting the first wafer 110. As can be seen, the movable support clips 1620 have lowered the wafer 110 to the bypass thermal adjuster 1630 lower half. Alternatively, the movable support clips 1620 may keep the wafer 110 elevated above the bypass thermal adjuster 1630 bottom half to allow the gas 410 to circulate around the wafer 110.

Figure 18:
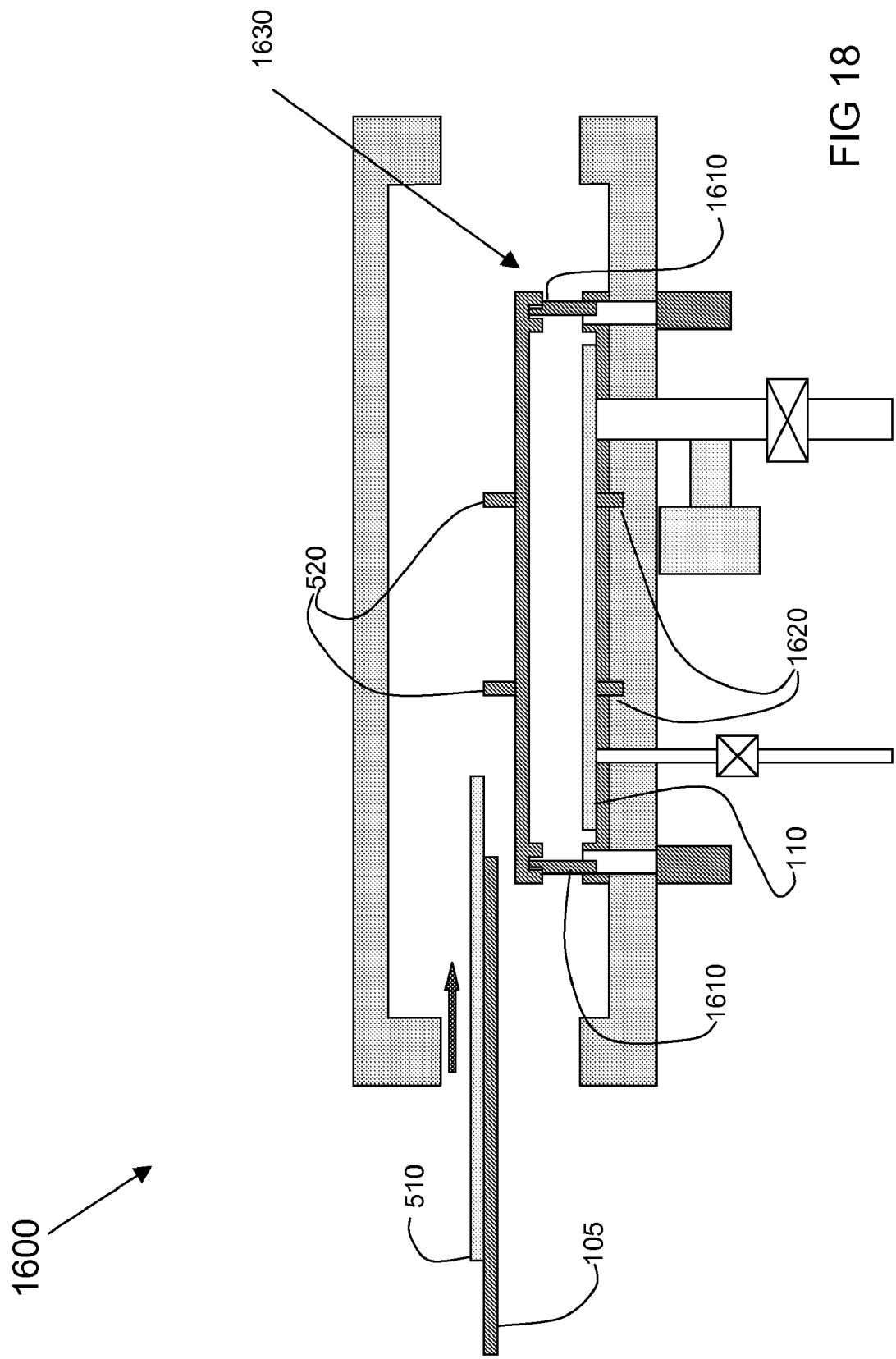
FIG. 18 shows a second work piece being loaded onto support pins above the enclosure.

FIG. 18 shows the transfer robot 105 loading the second wafer 510 onto the support clips 520.

Figure 19:
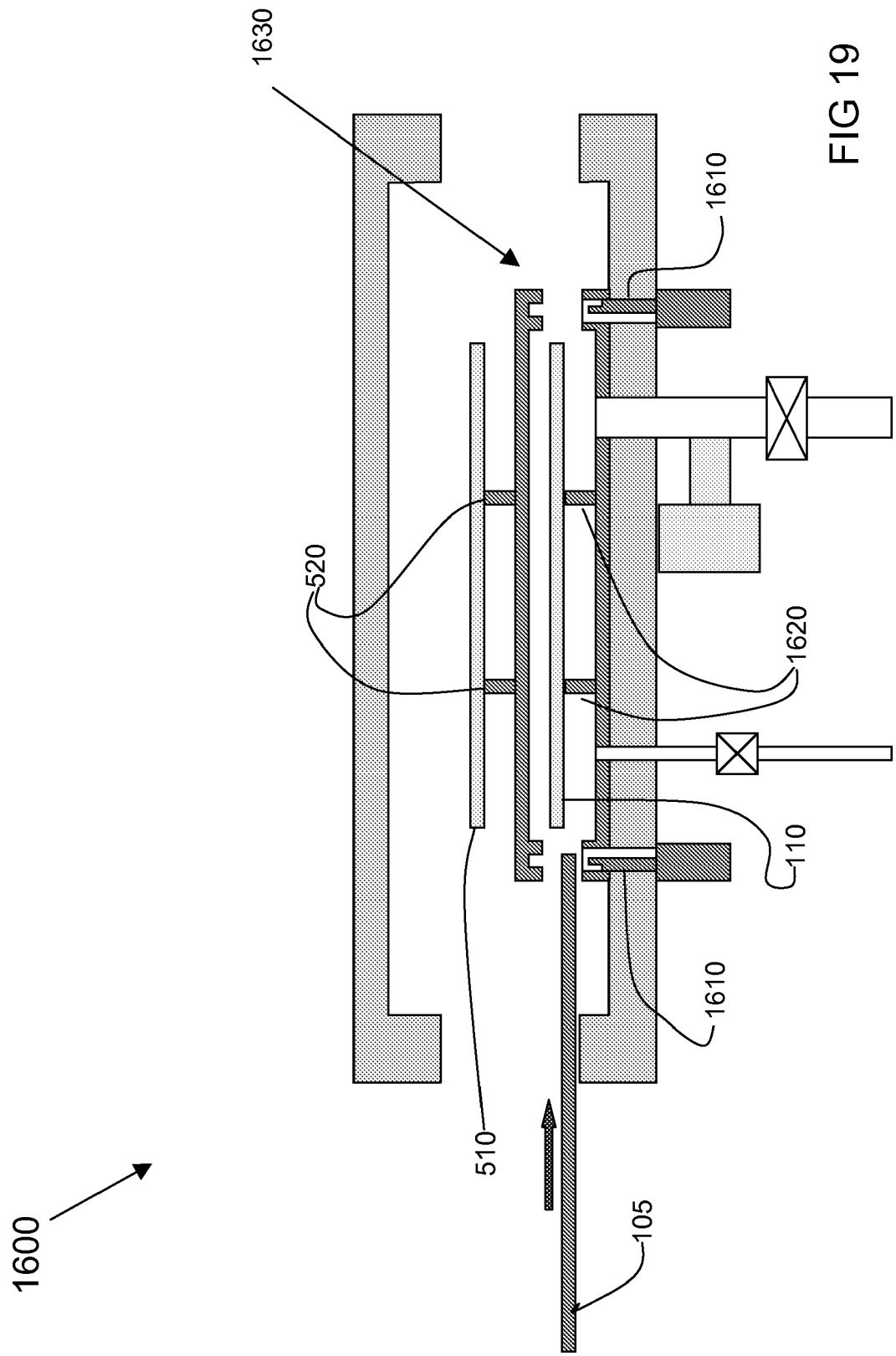
FIG. 19 shows a second work piece in place on support pins above the enclosure, with the enclosure slot valves open, and a robot retrieving the first work piece.

FIG. 19 shows the transfer robot 105 retrieving the first wafer 110 after the thermal adjustment is complete and the moving slot valves 1610 are open. The advantage of this configuration with fixed upper support clips 520 is shown, the second wafer 510 remains stationary while the first wafer is removed from the bypass thermal adjuster 1630. Additionally, with the fixed upper support clips 520, the second wafer 510 may be removed from the vacuum module 1600 using a second transfer robot at the same time the first wafer is removed from the bypass thermal adjuster 1630.

Figure 20:
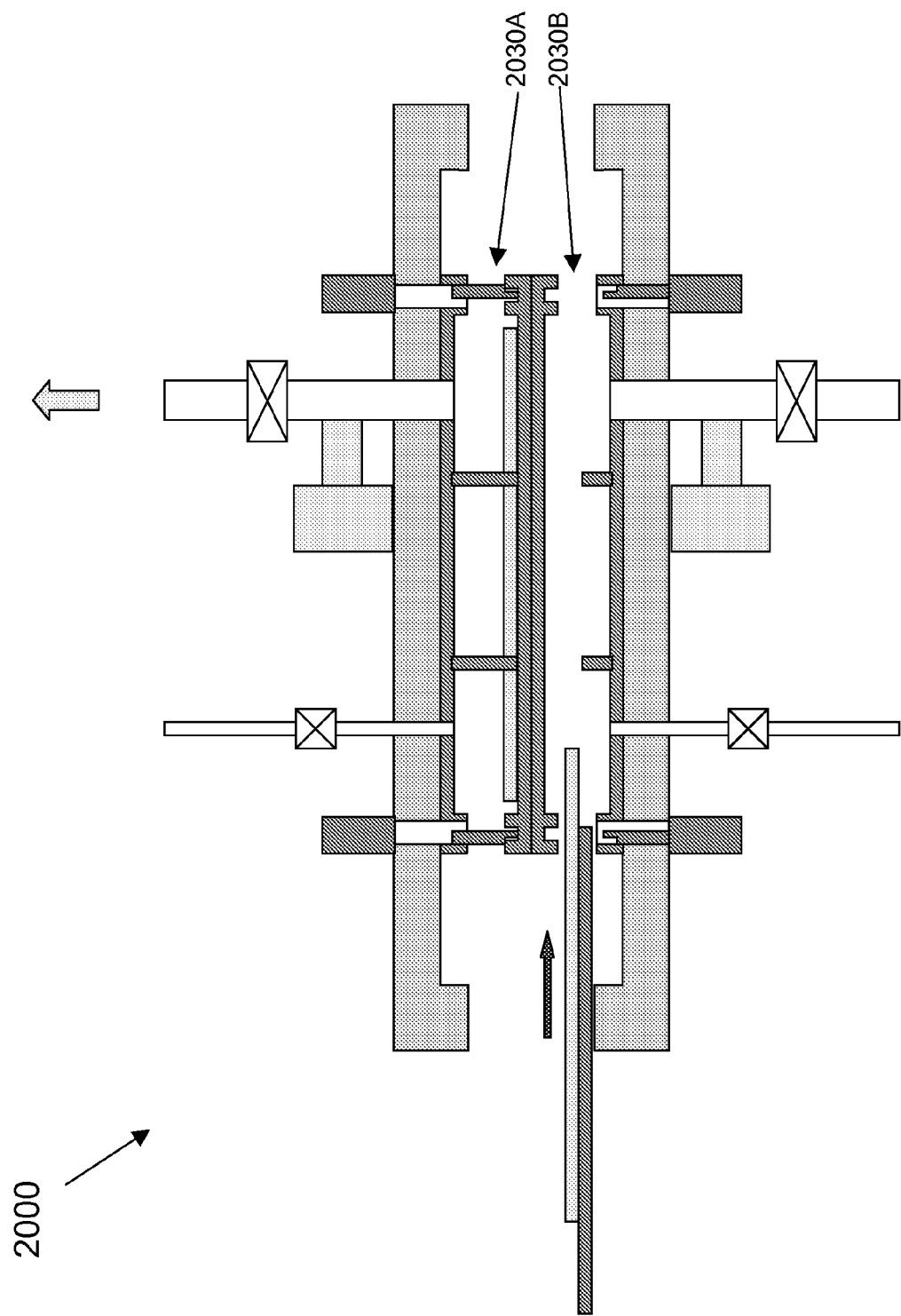
FIG. 20 shows an upper and lower fixed enclosure configuration with slot side valves, wherein the upper enclosure is filled with gas.

FIG. 20 and FIG. 21 show a dual configuration of the fixed bypass thermal adjuster embodiment of FIG. 16. Independent operation of upper bypass thermal adjuster 2030A and lower bypass thermal adjuster 2030B may enable independent thermal adjustment of two wafers within the vacuum module 2000.

Alternative embodiments may include one or more bypass thermal adjusters without exterior support clips. In addition, while the foregoing embodiments describe single-wafer thermal bypass adjusters, each adjuster may be adapted to handle multiple wafers, and may provide for independent or common thermal management of such multiple wafers. The vacuum module may also be adapted for more versatile temporary storage, such as by permitting storage of one or more wafers without placing them in isolation, while passing additional wafers through the vacuum module. While such bypass functions are known, a combination of temporary storage, isolation and thermal adjustment, and bypass, provides significant additional advantages in terms of processing flexibility for a semiconductor fabrication facility. Also, while described in the context of a vacuum semiconductor processing environment, the systems and methods disclosed herein may be usefully employed in a non vacuum environment, and may be useful in processing systems other than semiconductor manufacturing. Further, the vacuum modules and/or bypass thermal adjusters described herein may incorporate additional features that support functions such as metrology, alignment, marking, or any other functional suitable for use in a wafer handling system.

While the invention has been disclosed in connection with the preferred embodiments shown and described in detail, various modifications and improvements thereon will become readily apparent to those skilled in the art. Accordingly, the spirit and scope of the present invention is not to be limited by the foregoing examples, but is to be understood in the broadest sense allowable by law.

What is claimed is:

1. A system comprising:
    a vacuum module in a semiconductor manufacturing system, the vacuum module having a frame defining a continuous interior environment and having a substantially straight wafer transfer path extending there through;
    a sealable enclosure within the interior environment of the vacuum module, the sealable enclosure including a support for at least one wafer, the sealable enclosure being configured to selectively isolate an environment within the sealable enclosure from the interior environment of the vacuum module;
    a buffer disposed within the interior environment and having at least one additional wafer support, each of at least one additional wafer support being configured to support a wafer, where the sealable enclosure and the buffer are both disposed along the wafer transfer path and each of the at least one additional wafer support being continuously accessible so that wafers are transportable to and from the at least one additional wafer support in opposite directions along the substantially straight wafer transfer path independent of the sealable enclosure being sealed and unsealed; and
    a control system including a thermal management system that controls a temperature of the at least one wafer within the sealable enclosure, the control system being further configured to provide straight through transfer of wafers through the vacuum module along the substantially straight wafer transfer path without cycling an interior environment of the vacuum module.

2. The system of claim 1 further comprising a plurality of sealable enclosures within the interior of the vacuum module.

3. The system of claim 1 further comprising a plurality of entries to the vacuum module providing access by a robotic wafer handler.

4. The system of claim 1 further comprising a vacuum management system to control a vacuum within the environment of the sealable enclosure.

5. The system of claim 1 wherein the environment of the sealable enclosure is selected from a group consisting of a nitrogen environment, an argon environment, and a helium environment.

6. The system of claim 1 wherein the thermal management system cools the at least one wafer.

7. The system of claim 1 wherein the thermal management system heats the at least one wafer.

8. The system of claim 1 wherein the thermal management system directly contacts the wafer.

9. The system of claim 1 wherein the vacuum module is coupled to a semiconductor fabrication system.

10. The system of claim 1 wherein the vacuum module permits additional wafers to pass through the interior while the sealable enclosure holds the at least one wafer in isolation.

11. The system of claim 1 further comprising a second sealable enclosure within the interior of the vacuum module, the second sealable enclosure including a second support for at least one second wafer, and the second sealable enclosure capable of selectively isolating a second environment within the second sealable enclosure from the interior of the vacuum module.

12. The system of claim 11 wherein the second sealable enclosure is vertically stacked with the sealable enclosure.

13. The system of claim 11 wherein the second sealable enclosure can be isolated independently from the sealable enclosure.

14. The system of claim 11 wherein the vacuum module permits additional wafers to pass through the interior while the sealable enclosure holds the at least one wafer in isolation.

15. The system of claim 14 wherein the vacuum module permits additional wafers to pass through the interior while the second sealable enclosure holds the at least one second wafer in isolation.

16. The system of claim 1 wherein the wafer transfer path is a substantially planar wafer transport path extending between entries in walls of the vacuum module for transferring wafers through the vacuum module.

17. The system of claim 1 wherein the buffer and the sealable enclosure are vertically stacked one above the other.

18. The system of claim 1 wherein the vacuum module is configured to allow passive transfer of wafers through the vacuum module by transfer robots disposed external to the vacuum module.

19. A system comprising:
    a vacuum module in a semiconductor manufacturing system, the vacuum module having a frame defining a continuous interior environment and having a substantially straight wafer transfer path extending there through;
    a sealable enclosure within the interior environment of the vacuum module, the enclosure including a support for at least one wafer, and the enclosure capable of moving a wafer out of a path through the vacuum module;
    a buffer disposed within the interior environment and having at least one additional wafer support, each of the at least one additional wafer support being configured to support a wafer, where the enclosure and the buffer are both disposed along the wafer transfer path and each of the at least one wafer support being continuously accessible so that wafers are transportable to and from the at least one wafer support in opposite directions along the substantially straight wafer transfer path independent of the sealable enclosure being sealed and unsealed; and
    a control system including a thermal management system configured to control a temperature of the wafer within the enclosure while at least one other wafer is passed straight through the interior environment along the substantially straight wafer transport path without cycling the interior environment of the vacuum module.

* * * * *

UNITED STATES PATENT AND TRADEMARK OFFICE
CERTIFICATE OF CORRECTION

| | | Page 1 of 1 |
|---|---|---|
| PATENT NO. | : 8,403,613 B2 | |
| APPLICATION NO. | : 11/681822 | |
| DATED | : March 26, 2013 | |
| INVENTOR(S) | : van der Meulen | |

It is certified that error appears in the above-identified patent and that said Letters Patent is hereby corrected as shown below:

In the Specification

Column 1, Line 7, delete "2007" and insert --2007,-- therefor.

Column 1, Line 11, delete "2004 now U.S. Pat. No. 7,458,753 ," and insert --2004, now U.S. Pat. No. 7,458,763,-- therefor.

In the Claims

Column 11, Claim 1, Line 27, delete "of" and insert --of the-- therefor.

Column 12, Claim 19, Line 49, delete "one" and insert --one additional-- therefor.

Column 12, Claim 19, Line 51, delete "one" and insert --one additional-- therefor.

Signed and Sealed this
Sixteenth Day of September, 2014

Michelle K. Lee
*Deputy Director of the United States Patent and Trademark Office*